US012414365B2

(12) United States Patent
Liaw

(10) Patent No.: US 12,414,365 B2
(45) Date of Patent: Sep. 9, 2025

(54) METAL GATE STACKS AND METHODS OF FABRICATING THE SAME IN MULTI-GATE FIELD-EFFECT TRANSISTORS

(71) Applicant: Taiwan Semiconductor Manufacturing Company, Ltd., Hsin-Chu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/357,796

(22) Filed: Jul. 24, 2023

(65) Prior Publication Data

US 2023/0369323 A1 Nov. 16, 2023

Related U.S. Application Data

(63) Continuation of application No. 17/377,578, filed on Jul. 16, 2021, now Pat. No. 11,721,695.

(51) Int. Cl.
*H10D 84/83* (2025.01)
*H10D 30/01* (2025.01)
*H10D 30/62* (2025.01)
*H10D 84/01* (2025.01)
*H10D 84/03* (2025.01)

(52) U.S. Cl.
CPC ....... *H10D 84/834* (2025.01); *H10D 30/0243* (2025.01); *H10D 30/6211* (2025.01); *H10D 30/6215* (2025.01); *H10D 84/013* (2025.01); *H10D 84/0158* (2025.01); *H10D 84/038* (2025.01)

(58) Field of Classification Search
CPC ......... H01L 27/0886; H01L 21/823418; H01L 21/823431; H01L 29/6681; H01L 29/7851; H01L 29/7855; H10D 30/6211; H10D 30/6215; H10D 30/0243; H10D 84/834; H10D 84/013; H10D 84/0158; H10D 84/038

See application file for complete search history.

(56) References Cited

U.S. PATENT DOCUMENTS

| | | | |
|---|---|---|---|
| 9,379,221 B1 | 6/2016 | He et al. | |
| 10,879,308 B1 * | 12/2020 | Ando | H10B 63/845 |
| 2019/0131394 A1 * | 5/2019 | Reznicek | H01L 21/30604 |
| 2019/0378911 A1 | 12/2019 | Lee et al. | |
| 2020/0013870 A1 * | 1/2020 | Ha | H01L 29/42392 |

(Continued)

*Primary Examiner* — Christine A Enad
(74) *Attorney, Agent, or Firm* — HAYNES AND BOONE, LLP

(57) ABSTRACT

A semiconductor structure includes a substrate, a semiconductor fin protruding from the substrate, where the semiconductor fin includes semiconductor layers stacked in a vertical direction, a gate stack engaging with channel regions of the semiconductor fin, and source/drain (S/D) features disposed adjacent to the gate stack in S/D regions of the semiconductor fin. In the present embodiments, the gate stack includes a first portion disposed over the semiconductor layers and a second portion disposed between the semiconductor layers, where the first portion includes a workfunction metal (WFM) layer and a metal fill layer disposed over the WFM layer and the second portion includes the WFM layer but is free of the metal fill layer.

20 Claims, 26 Drawing Sheets

(56) References Cited

U.S. PATENT DOCUMENTS

| | | | |
|---|---|---|---|
| 2020/0127054 A1* | 4/2020 | Ando | H10N 70/021 |
| 2021/0305380 A1* | 9/2021 | Bouche | H01L 29/78696 |
| 2022/0059533 A1* | 2/2022 | Bae | H01L 21/823821 |

* cited by examiner

METAL GATE STACKS AND METHODS OF FABRICATING THE SAME IN MULTI-GATE FIELD-EFFECT TRANSISTORS

PRIORITY DATA

This is a continuation application of U.S. application Ser. No. 17/377,578, filed Jul. 16, 2021, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, multi-gate transistors, such as nanostructure (NS) transistors, have been incorporated into memory devices (including, for example, static random-access memory, or SRAM, cells) and core devices (including, for example, standard logic, or STD, cells) to reduce chip footprint while maintaining reasonable processing margins. However, designing IC chips that include NS transistors for multiple applications involves complex and oftentimes costly processes. Accordingly, although existing technologies for fabricating NS transistors have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
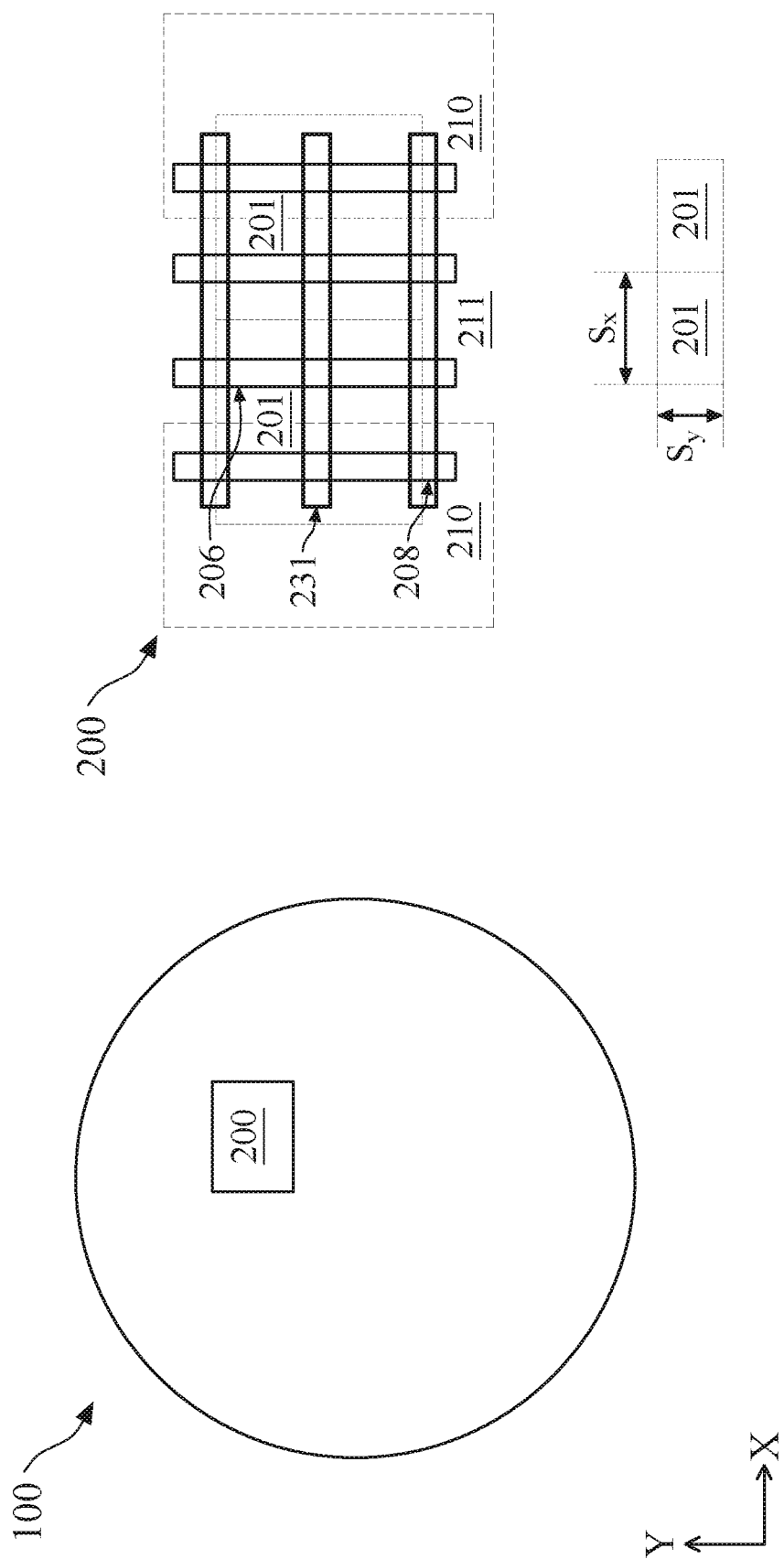
FIG. 1A is a diagrammatic plan view of an IC structure, in portion or entirety, according to various aspects of the present disclosure.
FIG. 1B is a diagrammatic plan view of a portion of the IC structure of FIG. 1A according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional nanostructure (NS) FETs (alternatively referred to as gate-all-around, or GAA, FETs), in memory and/or standard logic cells of an integrated circuit (IC) structure. Generally, an NS FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. The present disclosure includes multiple embodiments. Different embodiments may have different advantages, and no particular advantage is necessarily required of any embodiment.

As length scales in semiconductor devices continue to decrease, reduced separation distance between vertically stacked nanostructures (e.g., nanosheets, nanorods, nanowires) in an NS FET is desired for purposes of reducing resistance in S/D features as well as capacitance between the gate (e.g., a metal gate stack) and the S/D features of a device, among others. However, in some instances, tightened separation distance between vertically stacked nanostructures may limit the formation and the performance of a metal gate stack configured to wrap around each nanostructure. In one such example, tightened separation distance may lead to a lack of flexibility in tuning the threshold voltage ($V_t$) of the metal gate stack due to a reduced number of WFM layers that can be formed. In another example, tightened separation distance may lead to a potential increase in the resistance of the metal gate stack due to reduced thickness of the low-resistance metal fill (or bulk conductive) layer. Thus, for at least these reasons, improvements in the fabrication of metal gate stacks in NS FETs are desired.

Referring to FIGS. 1A and 1B, the present disclosure provides an IC structure (e.g., an IC chip) 100 formed over a semiconductor substrate and includes at least one IC device 200 (hereafter referred to as device 200). The device 200 is provided for illustration purposes and does not necessarily limit the embodiments of the present disclosure to any number of transistors, any number of regions, or any configuration of structures or regions. Furthermore, the device 200, or a portion thereof, may include memory devices (e.g., static random-access memory (SRAM), dynamic random-access memory (DRAM)), standard logic circuits, passive components such as resistors, capacitors, and inductors, and active components such as p-type FETs (PFETs), n-type FETs (NFETs), multi-gate FETs such as FinFETs and NS FETs, metal-oxide semiconductor field effect transistors (MOSFETs), complementary metal-oxide semiconductor FET (CMOSFET), bipolar transistors, high voltage transistors, high frequency transistors, other memory cells, and combinations thereof. Additional features can be added to the device 200 and/or the IC structure 100, and some of the features described below can be replaced, modified, or eliminated in other embodiments of the IC structure 100.

Referring to FIG. 1B, the device 200 includes at least two cells 201 disposed along the X-axis, where each cell 201 is configured to include a p-type three-dimensional fin-like active region 206 (hereafter referred to as p-type fin 206) disposed in a p-type doped region 211 (hereafter referred to as p-well 211) and a three-dimensional fin-like active region 208 (hereafter referred to as n-type fin 208) disposed in an n-type doped region 210 (hereafter referred to as n-well 210), where the n-well 210 is disposed adjacent to the p-well 211 within each cell 201. In the present embodiments, p-wells 211 of the two adjacent cells 201 are disposed between the n-wells 210. The p-type fins 206 and the n-type fins 208 are oriented lengthwise along the Y-axis and spaced from each other along the X-axis.

Each cell 201 may be defined by the long pitch $S_x$ along the X-axis and the short pitch $S_y$ along the Y-axis. In the present embodiments, the two cells 201 are depicted to be substantially similar in dimension, i.e., having substantially the same $S_x$ and $S_y$. However, because different cells 201 may be directed to different applications, the cells 201 in the device 200 may differ in dimension and layout design.

Figure 2:
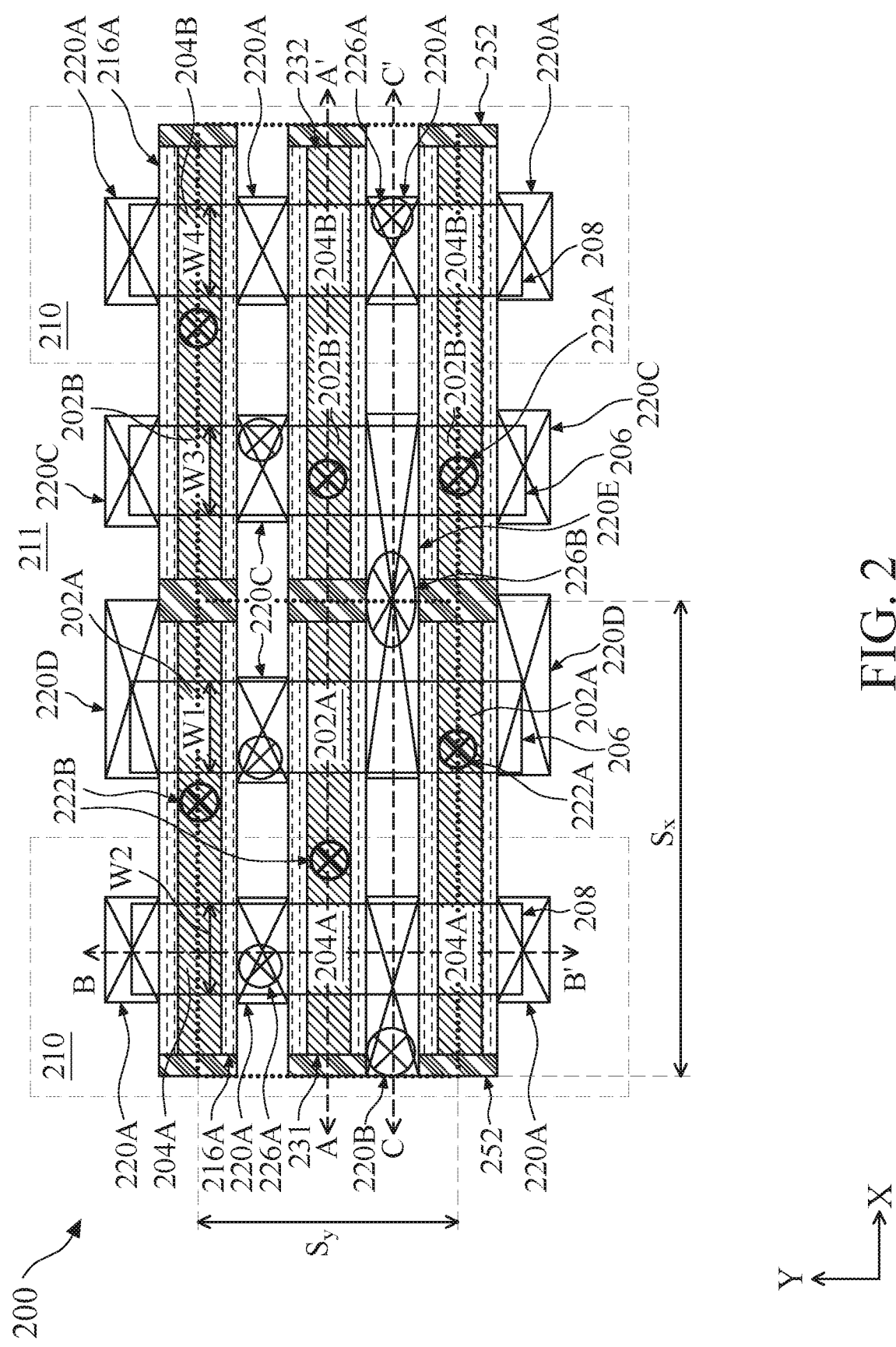
FIG. 2 is a diagrammatic plan view of an IC device, in portion or entirety, according to various aspects of the present disclosure.
Figure 5:
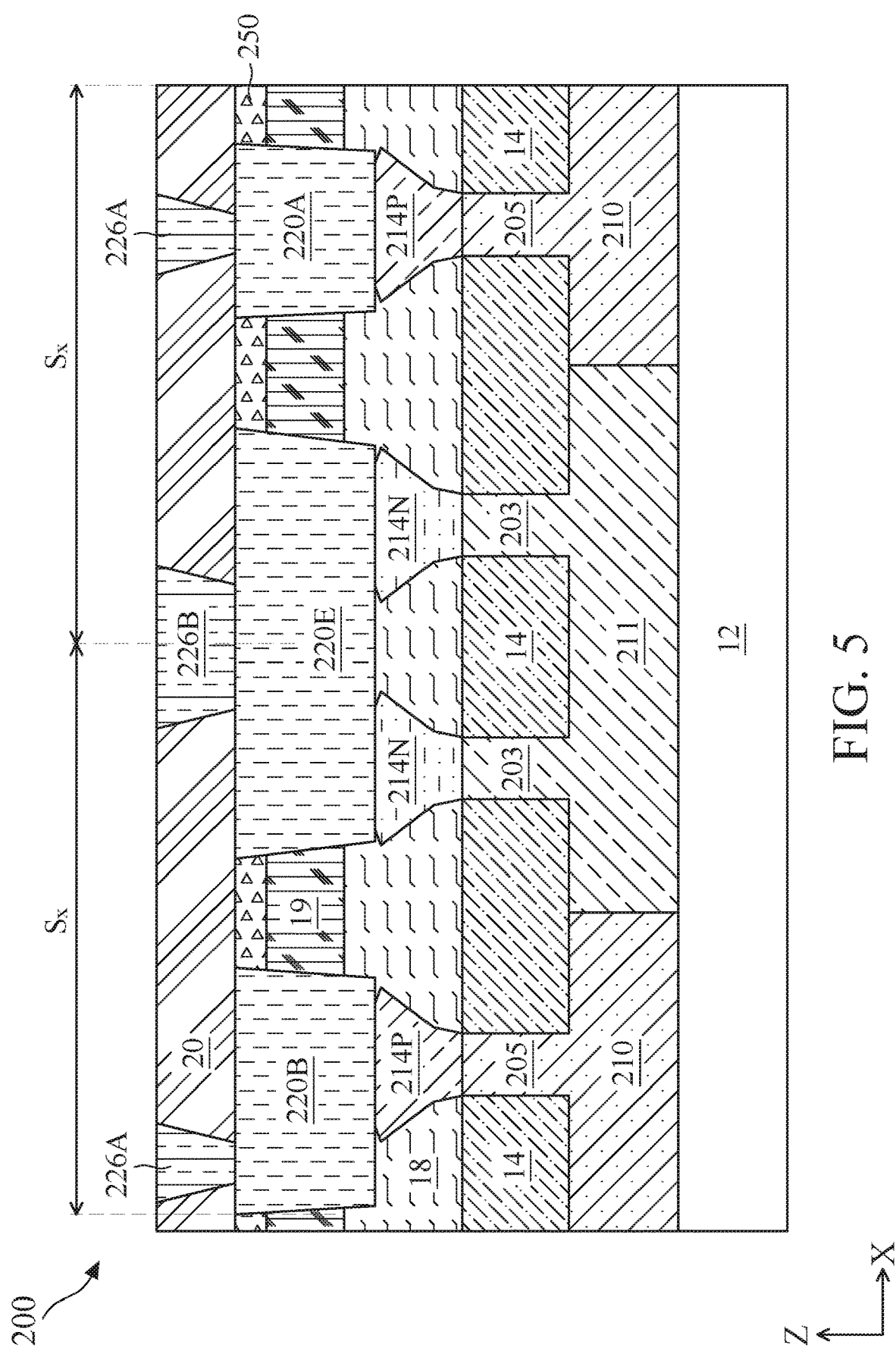
FIG. 5 is a cross-sectional view of the IC device of FIG. 2 taken along line CC' according to various aspects of the present disclosure.

Each cell 201 further includes a gate stack 231 and a gate stack 232 oriented substantially perpendicular to the p-type fins 206 and the n-type fins 208 (i.e., disposed along the Y-axis). In the present embodiments, adjacent gate stacks 231 and 232 along the X-axis are separated by gate isolation features (or alternatively referred to as gate end isolation features) 252. As will be discussed in detail below, an upper portion of each of the gate stacks 231 and 232 is disposed over a top surface of the p-type fins 206 and the n-type fins 208, and a lower portion of each of the gate stacks 231 and 232 wrap around channel regions of the p-type fins 206 and the n-type fins 208. In the depicted embodiments, the gate stacks 231 and 232 each include top gate spacers 216A disposed on sidewalls of the upper portion (as depicted in FIG. 2) and inner gate spacers 216B disposed on sidewalls of the lower portion (as depicted in FIG. 5). In some embodiments, the gate stacks 231 and 232 have substantially the same composition. In some embodiments, the gate stacks 231 and 232 differ in the composition of the gate electrode as discussed in detail below.

Figure 3:
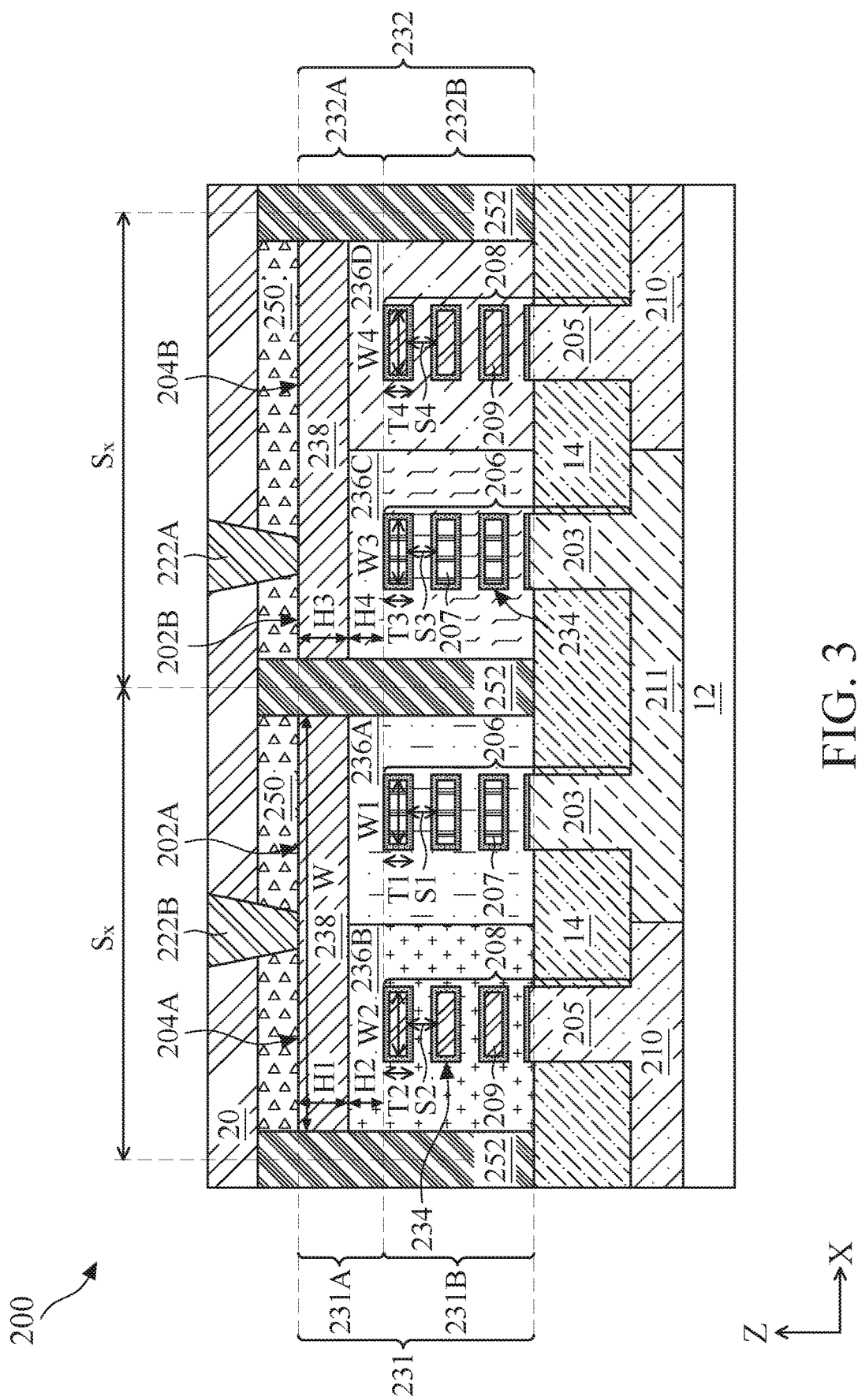
FIG. 3 is a cross-sectional view of the IC device of FIG. 2 taken along line AA' according to various aspects of the present disclosure.
Figure 4:
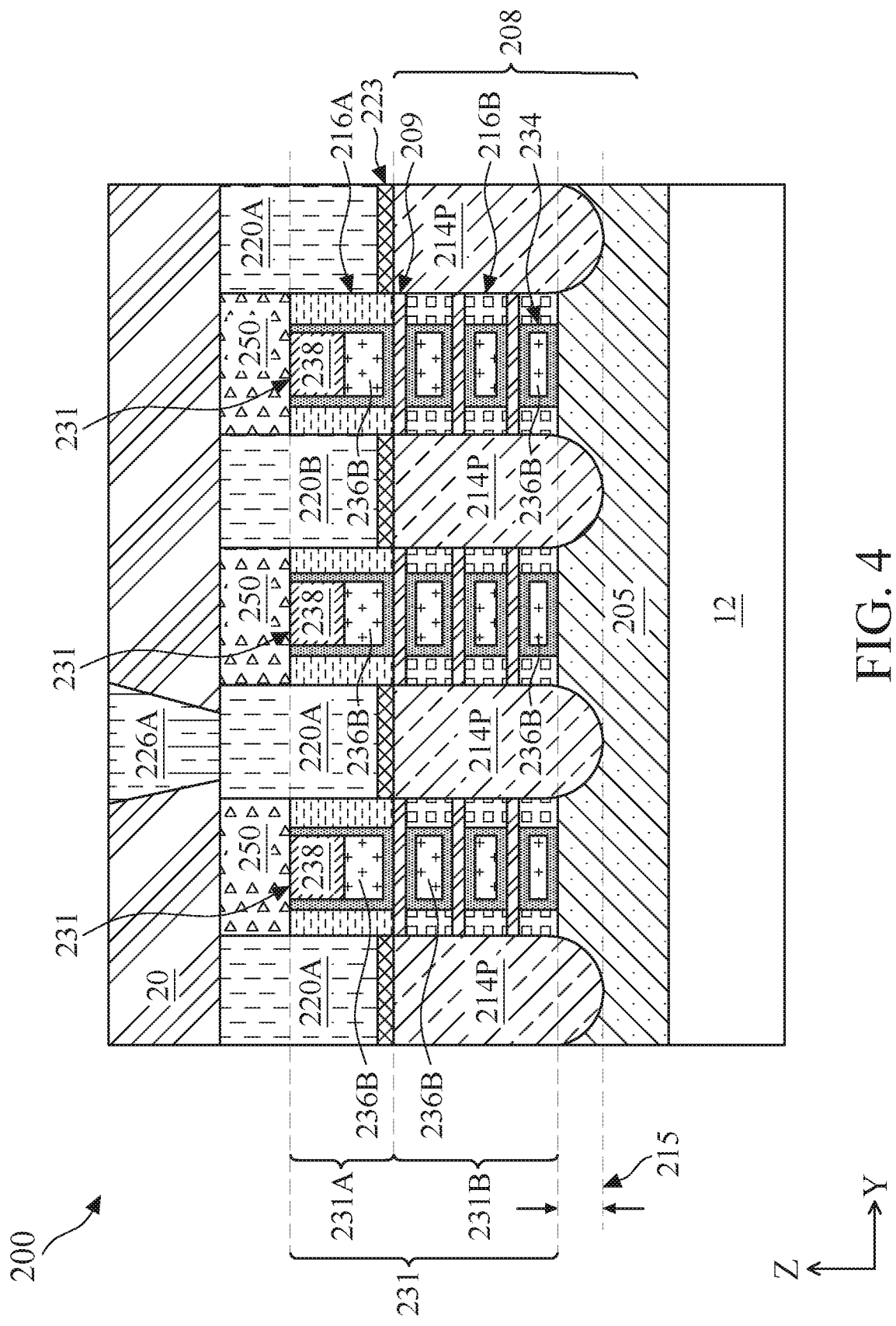
FIG. 4 is a cross-sectional view of the IC device of FIG. 2 taken along line BB' according to various aspects of the present disclosure.

Various embodiments of portions of the device 200 are discussed in detail below. FIG. 2 shows a schematic planar top view of an embodiment of the device 200 (or a portion thereof), FIG. 3 is a schematic cross-sectional view of FIG. 2 taken along line AA', FIG. 4 is a schematic cross-sectional view of FIG. 2 taken along line BB', and FIG. 5 is a schematic cross-sectional view of FIG. 2 taken along line CC'. It is noted that FIGS. 2-5 have each been simplified for the sake of clarity to better illustrate embodiments of the present disclosure. As such, additional features can be added to the device 200, and some of the features described below can be replaced, modified, or eliminated in other embodiments of the cells 201.

Referring now to FIGS. 2 and 3 collectively, each p-type fin 206 includes a first set of vertically stacked semiconductor layers 207 that engage with the gate stack 231 or 232 to form an n-type NS FET (hereafter referred to as a NS NFET), and each n-type fin 208 includes a second set of vertically stacked semiconductor layers 209 that engage with the gate stack 231 or 232 to form a p-type NS FET (hereafter referred to as a NS PFET). In the present embodiments, the semiconductor layers 207 and 209 are generally oriented lengthwise along the Y-axis and stacked vertically along the Z-axis. Furthermore, each stack of the semiconductor layers 207 is interposed between n-type source/drain (S/D) features 214N, and each stack of the semiconductor layers 209 is interposed between p-type S/D features 214P (as depicted in FIG. 4).

In the present embodiments, the semiconductor layers 207 engage with (or are wrapped around by) the gate stack 231 to form channel regions of an NS NFET 202A, and the semiconductor layers 209 engage with (or are wrapped around by) the gate stack 231 to form channel regions of an NS PFET 204A. Furthermore, the semiconductor layers 207 engage with the gate stack 232 to form channel regions of an NS NFET 202B, and the semiconductor layers 209 engage with the gate stack 232 to form channel regions of an NS PFET 204B. In other words, the semiconductor layers 207 are configured (and hereafter referred to) as channel layers 207 for the NS NFETs 202A and 202B, and the semiconductor layers 209 are configured (and hereafter referred) as channel layers 209 for the NS PFETs 204A and 204B. In the present embodiments, the NS NFET 202A and the NS PFET 204A form a first NS CMOSFET and the NS NFET 202B and the NS PFET 204B form a second NS COMSFET. In some embodiments, though not depicted herein, two n-type fins 208 (or two p-type fins 206) may be disposed adjacent to each other and engage with the gate stack 231 to form two NS PFETs (or two NS NFETs). In the depicted embodiments, referring to FIGS. 2-4 for example, the NS NFET 202A and the NS PFET 204A share the common gate stack 231, and the NS NFET 202B and the NS PFET 204B share the common gate stack 232. As will be discussed in detail below, portions of the same gate stack configured to provide different NS FETs have different compositions according to some embodiments of the present disclosure.

Referring to FIG. 2, the device 200 further includes a plurality of S/D contacts 220A, 220B, 220C, 220D, and 220E disposed on one or more S/D features and oriented lengthwise along the X-axis. In the present embodiments, the S/D contacts 220A and 220B are configured to contact p-type S/D features 214P disposed over (or in) the n-type fins 208, and the S/D contacts 220C, 220D, and 220E are configured to contact n-type S/D features 214N disposed over (or in) the p-type fins 206. In some embodiments, different S/D contacts 220A-220E may vary in length along the X-axis. For example, the S/D contact 220B is longer than the S/D contact 220A, the S/D contact 220D is longer than the S/D contact 220C, and the S/D contact 220E is longer than the S/D contact 220D. In the depicted embodiments, the S/D contacts 220E may be electrically coupled to the n-type S/D features 214N of two adjacent NS NFETs (202A and 202B) and further connected to a vertical interconnect structure (e.g., via 226B). The S/D contacts 220A-220E may alternatively be referred to as device-level contacts to be differentiated from other contact features (e.g., vias and conductive lines) subsequently formed as portions of a multi-layer interconnect (MLI) structure over the device 200.

Still referring to FIG. 2, the device 200 may further include a plurality of vertical interconnect structures (or vias) configured to electrically connect various NS FETs with a subsequently formed metal layer (not depicted) and/or to electrically connect two metal layers together. In the depicted embodiments, the device 200 includes vias 226A configured to electrically connect one or more of the device-level S/D contacts 220A-220D with a subsequently formed metal layer and a via 226B configured to electrically connect two adjacent S/D contacts 220D together. In the present embodiments, the device 200 further includes a plurality of gate contacts 222A and 222B disposed over portions of the gate stacks 231 or 232. As depicted herein, the gate contacts 222A and 222B differ in their location with respect to the channel regions of the NS FETs of the device 200. For example, the gate contacts 222A are disposed on portions of the gate stacks 231 or 232 that are directly above the channel regions (i.e., the stacks of channel layers 207 or 209), while the gate contacts 222B are disposed on portions of the gate stacks 231 or 232 that are directly above isolation structures 14 disposed over a semiconductor substrate (or a wafer; hereafter referred to as substrate) 12 on which the device 200 is formed.

Referring to FIG. 3, components of the device 200 are disposed over the substrate 12, which includes n-wells 210 and p-wells 211 over which the n-type fins 208 and p-type fins 206 are formed, respectively. The device 200 further includes the isolation structures 14 disposed over the substrate 12 to electrically separate various active regions formed over the substrate 12. In the present embodiments, the isolation structures 14 include shallow trench isolation (STI) features. In the depicted embodiments, each stack of the channel layers 207 is disposed over a base fin 203 and each stack of the channel layers 209 is disposed over a base fin 205, where the base fins 203 and 205 protrude from the substrate 12 and are separated by the isolation structures 14.

Each of the channel layers 207 and 209 may include Si, Ge, SiC, SiGe, GeSn, SiGeSn, SiGeCSn, other suitable semiconductor materials, or combinations thereof. In the present embodiments, each of the semiconductor layers 207 and 209 includes elemental Si in the form of a nanosheet, a nanowire (e.g., a nanowire having a hexagonal cross-section), a nanorod (e.g., a nanorod having a square or circular cross-section), or other suitable configurations. In some embodiments, the p-type fin 206 and the n-type fin 208 each include two to ten channel layers 207 and 209, respectively. In the present embodiments, the p-type fin 206 and the n-type fin 208 each include no more than four channel layers 207 and 209, respectively. For example, the p-type fin 206 and the n-type fin 208 may each include three channel layers 207 and three channel layers 209, respectively. Of course, the present disclosure is not limited to such configurations and the number of semiconductor layers may be tuned according to design requirements for the device 200.

Still referring to FIG. 3, each stack of the channel layers 207 and 209 may be defined by a width of the stack measured along the lengthwise direction of the gate stacks 231 and 232, a layer thickness measured along the stacking direction of the channel layers, and a separation distance between adjacent layers. For example, each stack of the channel layers 207 engaged with the gate stack 231 has a width of W1, a layer thickness of T1, and a layer separation distance of S1, and each stack of the channel layers 209 engaged with the gate stack 231 has a width of W2, a layer thickness of T2, and a layer separation distance of S2. Similarly, each stack of the channel layers 207 engaged with the gate stack 232 has a width of W3, a layer thickness of T3, and a layer separation distance of S3, and each stack of the channel layers 209 engaged with the gate stack 232 has a width of W4, a layer thickness of T4, and a layer separation distance of S4. In the present embodiments, T1, T2, T3, and T4 are substantially the same in magnitude, and S1, S2, S3, and S4 are substantially the same in magnitude. In some examples, the sheet thickness T1, T2, T3, and T4 may each be about 4 nm to about 8 nm and the sheet separation distance S1, S2, S3, and S4 may each be about 6 nm to about 15 nm. In some embodiments, W1, W2, W3, and W4 are substantially the same in magnitude. In some embodiments, W2 is greater than W1 and W4 is greater than W3. For example, a ratio of W2 to W1 and a ratio of W4 to W3 may each be about 1.05 to about 2. It is noted that "substantially the same" as used in the present disclosure refers to a difference within about ±5% between two values. Of course, other dimensions of the stack width, the layer thickness, and the layer separation distance may also be applicable to embodiments of the present disclosure.

In the present embodiments, as will be discussed in detail below, the gate stack 231 includes a top portion 231A disposed over a bottom portion 231B and the gate stack 232 includes a top portion 232A disposed over a bottom portion 232B, where the top and the bottom portions of each gate stack differ in composition. Furthermore, portions of the same gate stack configured to form different FET devices, e.g., the NS NFETs and the NS PFETs, also differ in composition required by design criteria.

Referring to the gate stack 231 depicted in FIG. 3, the bottom portion 231B includes a gate dielectric layer 234 wrapping around each channel layer 207 and 209 of the NS NFET 202A and the NS PFET 204A, respectively. In the present embodiments, an additional portion of the gate dielectric layer 234 is disposed over the base fins 203 and 205, respectively. The gate dielectric layer 234 may include any suitable material, such as silicon oxide, silicon oxynitride, a high-k dielectric material (i.e., having a dielectric constant greater than that of silicon oxide, which is about 3.9) such as hafnium oxide, tantalum oxide, aluminum oxide, zirconium oxide, lanthanum oxide, titanium oxide, yttrium oxide, strontium titanate, other suitable dielectric materials, or combinations thereof. In some embodiments, the gate dielectric layer 234 has a dielectric constant k of greater than about 9. In some examples, the gate dielectric layer 234 may be about 0.5 nm to about 3 nm in thickness; though the present embodiments are not limited to such dimension. In some embodiments, the bottom portion 231B includes an interfacial layer (IL; not depicted) disposed between the p-type fin 206 and the n-type fin 208 (including their respective channel layers and base fin) and the gate dielectric layer 234, where the IL includes an oxide, such as silicon oxide.

The bottom portion 231B further includes a work-function metal (WFM) layer 236A and a 236B disposed over the gate dielectric layer 234 and configured to provide the NS NFET 202A and the NS PFET 204A, respectively. In the present embodiments, each of the WFM layers 236A and 236B completely fills the space disposed between two vertically stacked channel layers 207 and 209, respectively. In other words, each of the WFM layers 236A and 236B defines a sidewall of the bottom portion 231B of the gate stack 231. Accordingly, in the depicted embodiments, the WFM layers 236A and 236B extend laterally to directly contact the gate isolation features 252, which separate the gate stack 231 from an adjacent gate stack, such as the gate stack 232. In other words, each gate isolation feature 252 defines an outer sidewall of each of the WFM layers 236A and 236B. Notably, by configuring the space between the channel layer 207 and 209 to be filled completely with the WFM layers 236A and 236B, respectively, the present embodiments provide greater design flexibility in tuning the $V_t$ of the gate stack 231, improving performance of the NS FETs as a result.

Each of the WFM layers 236A and 236B may include one or more WFM, such as TiN, TaN, TiAl, TaAl, TaAlC, TiAlN, TiAlC, TaC, TaCN, TaSiN, WN, WNC, other suitable WFMs, or combinations thereof. In the present embodiments, each of the WFM layers 236A and 236B is substantially free of W, Cu, Ru, Co, or combinations thereof. In some embodiments, specific compositions of the WFM layers 236A and 236B are selected based on an overall work function desired for their respective FETs. In some embodiments, the WFM layer 236A and 236B differ in composition, such that the work function of the portion of the gate stack 231 configured to form the NS NFET 202A is different from the work function of the portion of the gate stack 231 configured to form the NS PFET 204A. In some embodiments, the difference in composition between the WFM layers 236A and 236B allows the $V_t$ of the resulting NS CMOSFET to be tuned according to a given design requirement. In some embodiments, the gate stack 231 includes additional material layer, such as a barrier layer, disposed between the gate dielectric layer 234 and the WFM layer 236A and/or 236B.

As discussed above, the top portion 231A of the gate stack 231 is disposed over the bottom portion 231B. In the present embodiments, the top portion 231A includes a metal fill layer (also referred to as a bulk conductive layer) 238 disposed over portions of the WFM layers 236A and 236B that extend beyond a top surface of the p-type fin 206 and the n-type fin 208. In other words, a bottom surface of the metal fill layer 238 defines the top surface of both the WFM layers 236A and 236B. In the present embodiments, sidewalls of the metal fill layer 238 are continuous with the outer sidewalls of the WFM layers 236A and 236B along the Z-axis, such that the sidewalls of the metal fill layer 248 are in direct contact with the gate isolation features 252, which isolates the gate stack 231 from adjacent gate stacks. Taken as a whole, the gate stack 231 includes at least a gate dielectric layer 234 wrapping around each channel layer 207 and 209, the WFM layers 236A and 236B disposed over the gate dielectric layer 234 and filling the space between two vertically stacked channel layers 207 and 209, respectively, and the metal fill layer 238 disposed over the top surfaces of the WFM layers 236A and 236B. Accordingly, the portion of the gate stack 231 providing the NS NFET 202A and the portion of the gate stack 231 providing the NS PFET 204A share the same metal fill layer 238 but differ in the composition of the WFM layers. Notably, the present embodiments provide that the bottom portion 231B of the gate stack 231 is free of the metal fill layer 238, which is included in the top portion 231A of the gate stack 231. In other words, the space between the channel layers 207 and 209 is free of the metal fill layer 238.

For the top portion 231A, the metal fill layer 238 may be defined by a thickness H1 measured along the stacking direction (i.e., the Z-axis) of the channel layers 207 and 209, and the WFM layers 236A and 236B may each be defined by a thickness H2. In some embodiments, H1 is at least the same as H2. It is noted that the present embodiments are not limited to such dimension so long as both H1 and H2 are greater than zero. In some instances, H1 and H2 may each be about 2 nm to about 20 nm. In some instances, H1 and H2 may each be about 4 nm to about 12 nm. As discussed in detail below, the thickness H1 of the metal fill layer 238 may be increased without needing to enlarge the layer separation distance (e.g., S1 and S2), thereby reducing the overall resistance of the metal gate stack 231.

In the present embodiments, the metal fill layer 238 includes W, Cu, Ru, Co, or combinations thereof and is substantially free of any of the WFM material discussed above with respect to the WFM layers 236A and 236B. In an example embodiment, the metal fill layer 238 includes W. In some embodiments, the composition of the metal fill layer 238 is selected such that the resistance of the metal fill layer 238 is less than the resistance of each of the WFM layers 236A and 236B.

Still referring to FIG. 3, the device 200 further includes an etch-stop layer (ESL) 250 disposed over the gate stack 231, i.e., over the metal fill layer 238, and an interlayer dielectric (ILD) layer 20 disposed over the ESL 250. The ESL 250 may include any suitable dielectric material, such as silicon nitride, silicon carbide, oxygen-doped silicon nitride (SiON), carbon-doped silicon nitride (SiCN), aluminum nitride, other suitable materials, or combinations thereof. The ILD layer 20 may include a low-k dielectric material, silicon oxide, doped silicate glass, other suitable materials, or combinations thereof. In the present embodiment, the ESL 250 and the ILD layer 20 differ in composition to ensure adequate etching selectivity therebetween during subsequent fabrication process.

As discussed above, the device 200 further includes the gate contacts 222A and 222B configured to electrically couple the gate stacks 231 and 232 with subsequently formed interconnect features. In the depicted embodiments, the gate contact 222A is disposed over the channel regions of any one or more of the NF FETs of the device 200, while the gate contact 222B is vertically offset from the channel regions of any one or more of the NF FETs and is instead disposed over the isolation structures 14. Notably, referring to FIG. 3, the present embodiments provide that a width W of the metal fill layer 238 spans across the entire width of the gate stack 231 between the gate isolation features 252 along the X-axis, which allows greater freedom in determining locations of the gate contacts 222A and 222B that are suitable for improving routing efficiency of the device 200.

Still referring to FIG. 3, the present embodiments provide that the gate stacks 231 and 232 have substantially the same structural arrangement. For example, the gate stack 232 includes the top portion 232A disposed over the bottom portion 232B, where the bottom portion 232B includes the gate dielectric layer 234 wrapping around each channel layer 207 and 209, WFM layers 236C and 236D disposed over the gate dielectric layer 234 and filling the space between two vertically stacked channel layers 207 and 209, and where the top portion 232A includes the metal fill layer 238 disposed over the top surfaces of the WFM layers 236C and 236D. In other words, the top portion 232A includes the metal fill layer 238 but the bottom portion 232B is free of the same. In some examples, the composition of the WFM layer 236C may be substantially the same as or different from the WFM layer 236A, which is discussed above with respect to the gate stack 231. Independently, the composition of the WFM layer 236D may be substantially the same as or different from the WFM layer 236B, which is also discussed above with respect to the gate stack 231. In the present embodiments, the composition of the WFM layers 236C and 236D are selected based on an overall work function desired for their respective FETs. For example, the WFM layer 236C and 236D may differ in composition, such that the work function of the portion of the gate stack 232 configured to form the NS NFET 202B is different from the work function of the portion of the gate stack 232 configured to form the NS PFET 204B, thereby allowing the $V_t$ of the resulting NS CMOSFET to be tuned according to a given design requirement. Furthermore, for the top portion 232A, the metal fill layer 238 is defined by a thickness H3 in the gate stack 232 and the portions of the WFM layers 236C and 236D disposed above the channel layers 207 and 209 are defined by a thickness H4, where H3 and H4 are similar to H1 and H2, respectively, i.e., H3≥H4, as discussed in detail above.

Generally, reducing the layer separation distance (e.g., S1, S2, S3, and S4) in an NS FET lowers the overall height of the channel region (or the height of the gate stack), such that both the parasitic capacitance between the gate stack and the S/D features as well as the resistance of the S/D features may be reduced for improved device performance. However, reduction in layer separation distance introduces challenges in the fabrication of the metal gate stack, such as limitation in the number of WFM layers and the thickness of the low-resistance metal fill layer that can be accommodated between the channel layers. The present embodiments provide methods of forming a metal gate stack with improved flexibility in $V_t$ tuning and ability to accommodate fabrication of low-resistance metal fill layer.

Now turning to FIG. 4, which is a cross-sectional view of FIG. 2 taken along line BB', i.e., through one of the n-type fins 208 along the Y-axis. In the depicted embodiments, each gate stack 231 (or 232) is disposed between two p-type S/D features 214P along the Y-axis, where the top portion 231A (or 232A) of the gate stack 231 (or 232) is disposed over the bottom portion 231B (or 232B), i.e., over the topmost channel layer 209. Stated differently, the bottom portion 231B of the gate stack 231 is interleaved with the channel layers 209. In the present embodiments, the bottom portion 231B includes the gate dielectric layer 234 disposed over the channel layers 209 (and in contact with the inner gate spacers 216B) and the WFM layer 236B over the gate dielectric layer 234 and filling the space between the channel layers 209. Notably, the bottom portion 231B is free of the metal fill layer 238 as discussed above with respect to FIG. 3. The top portion 231A includes the gate dielectric layer 234, the WFM layer 236B disposed over the gate dielectric layer 234, and the metal fill layer 238 disposed over the top surface of the WFM layer 236B. In the present embodiments, the gate dielectric layer 234 is disposed along and define the sidewalls of both the WFM layer 236B and the metal fill layer 238 in the top portion 231A. As discussed above, the device 200 further includes the ESL 250 disposed over the top surface of the gate stack 231 to accommodate subsequent fabrication of components such as the S/D contacts 220A and 220B. In some embodiments, a bottom portion of the p-type S/D features 214P extends to below the bottommost channel layer 209 by a distance 215 of about 3 nm to about 40 nm.

In the present embodiments, still referring to FIG. 4, the device 200 further includes the top gate spacers 216A disposed along the sidewalls of the top portion 231A, and the inner gate spacers 216B disposed on sidewalls on the gate dielectric layer 234 to separate the bottom portion 231B of the gate stack 231 from the adjacent p-type S/D features 214P. Each of the top gate spacers 216A and the inner gate spacers 216B may be a single-layer structure or a multi-layer structure and may include silicon oxide, silicon nitride, silicon carbide, oxygen-doped silicon nitride (SiON), carbon-doped silicon nitride (SiCN), oxygen-and-carbon-doped silicon nitride (SiOCN), oxygen-doped silicon carbide (SiOC), a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), other suitable materials, or combinations thereof. In some embodiments, the top gate spacers 216A and the inner gate spacers 216B have different compositions. In some embodiments, the top gate spacers 216A and/or the inner gate spacers 216B includes an air gap.

Still referring to FIG. 4, the device 200 may further include the S/D contacts 220A and 220B disposed over and electrically contact the p-type S/D features 214P. The device 200 may include a silicide layer 223 disposed between each of the S/D contacts 220A (and 220B) and the p-type S/D feature 214P. The silicide layer 223 may include nickel silicide, titanium silicide, cobalt silicide, other suitable silicides, or combinations thereof. The device may further include the via 226A disposed in the ILD layer 20 and over one or more of the S/D contacts 220A and 220B, thereby interconnecting the S/D contact with subsequently formed MLI structure over the device 200.

Now referring to FIG. 5, which is a cross-sectional view of FIG. 2 taken along line CC', i.e., through S/D regions of the NS NFETs (202A and 202B) and the NS PFETs (204A and 204B) along the X-axis. In the present embodiments, the NS NFETs 202A and 202B each include the n-type S/D feature 214N grown over the base fin 203 in the S/D region of the p-type fin 206, and the NS PFETs 204A and 204B each include the p-type S/D feature 214P grown over the base fin 205 in the S/D region of the n-type fin 208. The n-type S/D features 214N and the p-type S/D features 214P each include one or more epitaxially grown semiconductor layer doped with a suitable dopant. The n-type S/D features 214N may include one or more epitaxial layers of silicon (epi Si) or silicon carbon (epi SiC) doped with an n-type dopant such as arsenic, phosphorus, other n-type dopants, or combinations thereof. The p-type S/D features 214P may include one or more epitaxial layers of silicon germanium (epi SiGe) doped with a p-type dopant such as boron, germanium, indium, other p-type dopants, or combinations thereof. In some embodiments, the n-type S/D features 214N and the p-type S/D features 214P are grown from and wrap around at least a top portion of base fins 203 and 205, respectively. In some examples, adjacently disposed S/D features may be merged, such that their widths along the X-axis span over more than one fins.

Figure 6A:
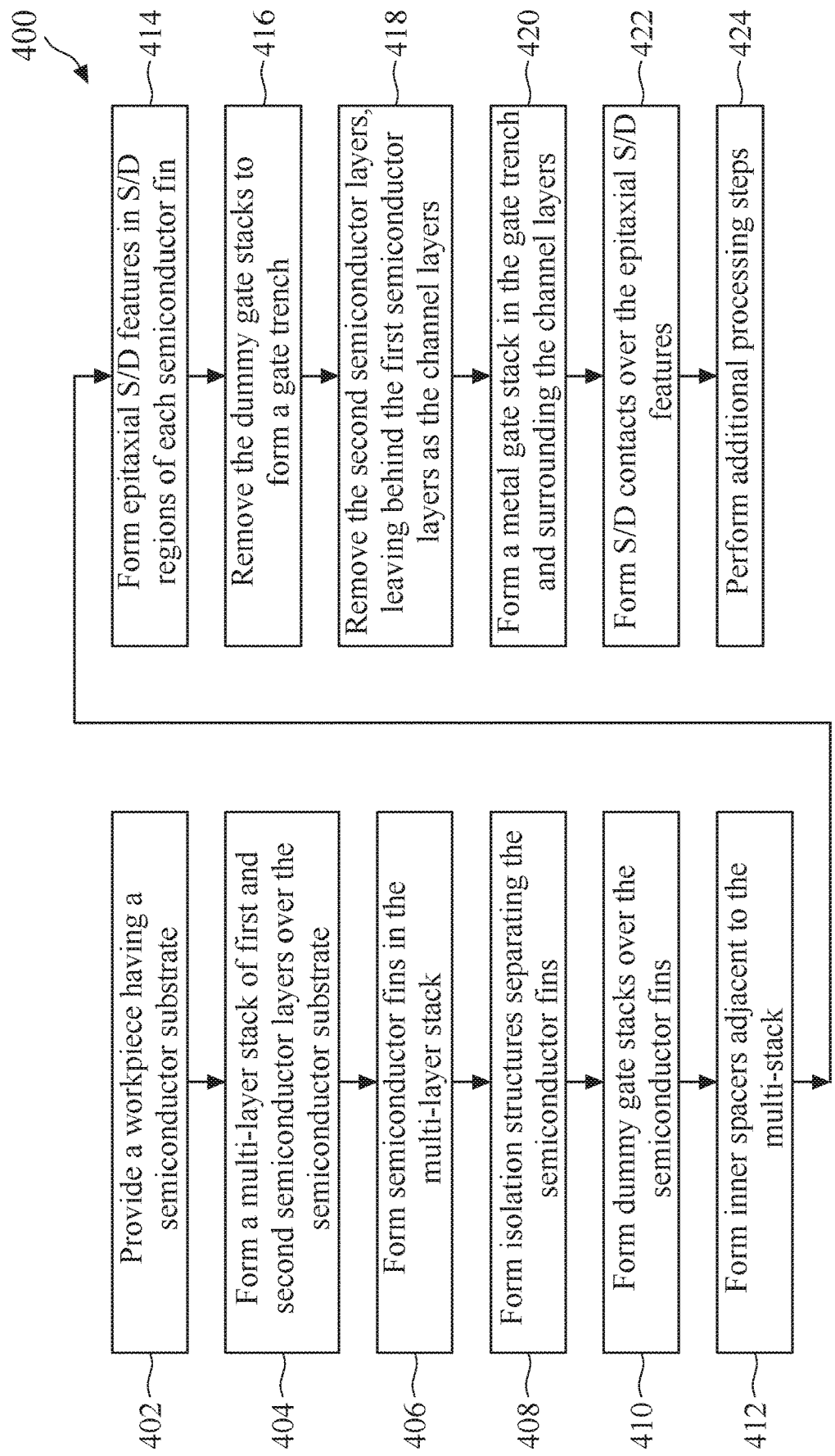
FIGS. 6A and 6B together illustrate a flow chart of a method for fabricating an IC device according to various aspects of the present disclosure.
Figure 6B:
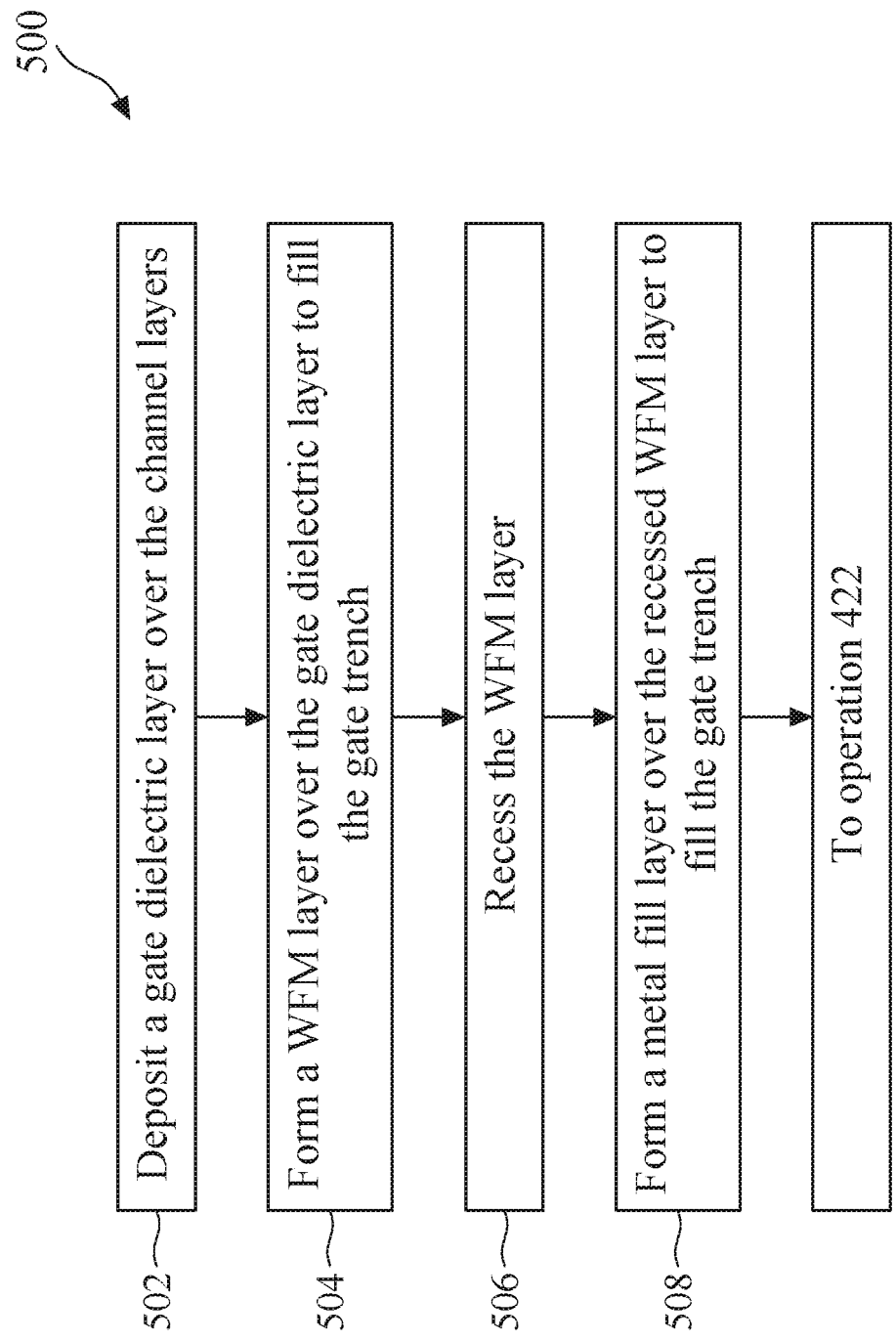
Figure 7:
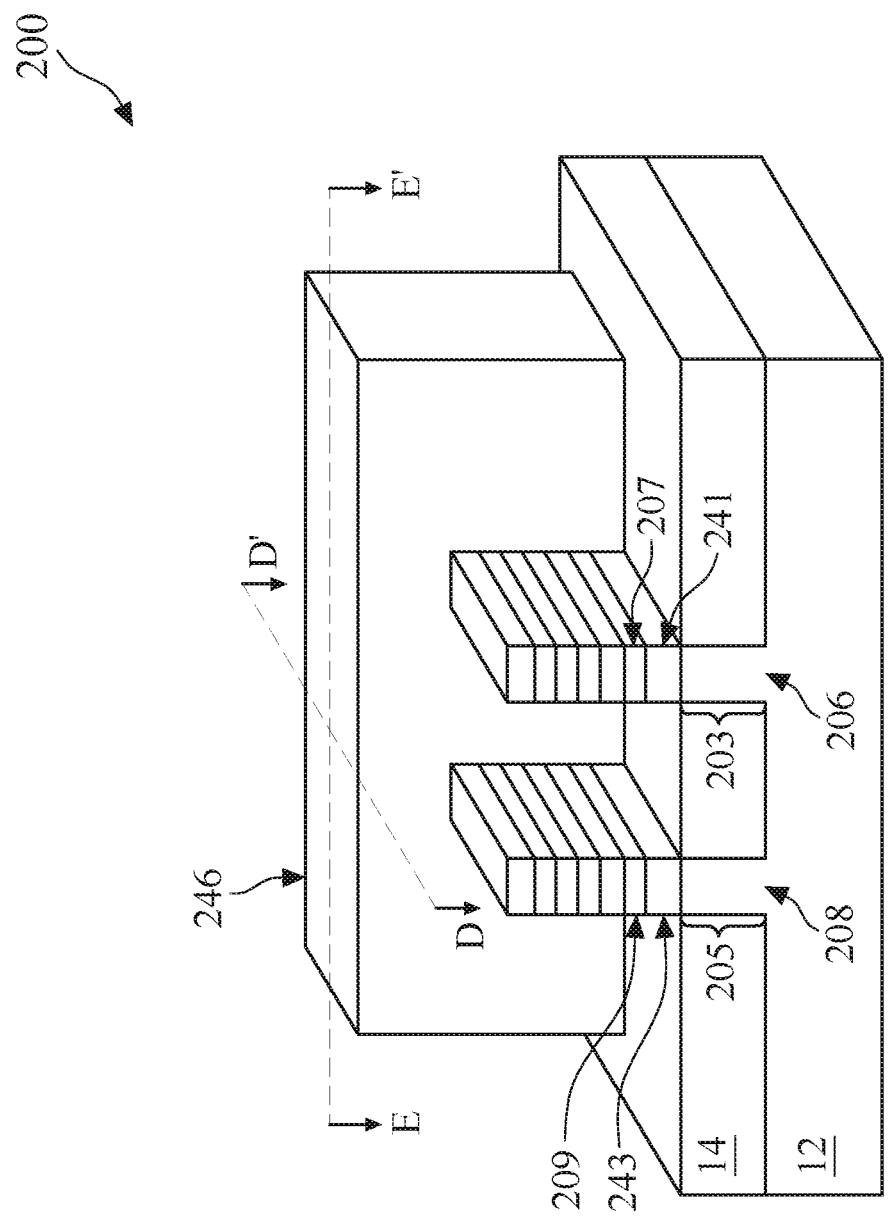
FIG. 7 is a three-dimensional perspective view of an IC device according to various aspects of the present disclosure.

FIGS. 6A and 6B illustrates a method 400 and a method 500 for forming the device 200, or portions thereof, in accordance with some embodiments of the present disclosure. The methods 400 and 500 are discussed in reference to FIGS. 7-18B, where FIG. 7 is a three-dimensional perspective view of the device 200, FIGS. 8A, 9-12, 13A, 14A, 15A, 16A, 17A, 18A, and 19A are cross-sectional views of FIG. 7 taken along line DD', and FIGS. 8B, 13B, 14B, 15B, 16B, 17B, 18B, and 19B are cross-sectional views of FIG. 7 taken along line EE', all at intermediate steps of the methods 400 and/or 500. It is noted that although the methods 400 and 500 are discussed in reference to the cross-sectional views of one of the n-type fins 208 as depicted in FIGS. 8A, 9-12, 13A, 14A, 15A, 16A, 17A, 18A, and 19A, the p-type fin 206 undergoes the substantially the same operations (which may be implemented together or separately) in accordance with the embodiments provided herein. The methods 400 and 500 are merely examples and are not intended to limit the present disclosure beyond what is explicitly recited in the claims. Additional operations can be performed before, during, and after the method 400 or the method 500, and some operations described can be replaced, eliminated, or moved around for additional embodiments of the methods.

Figure 8A:
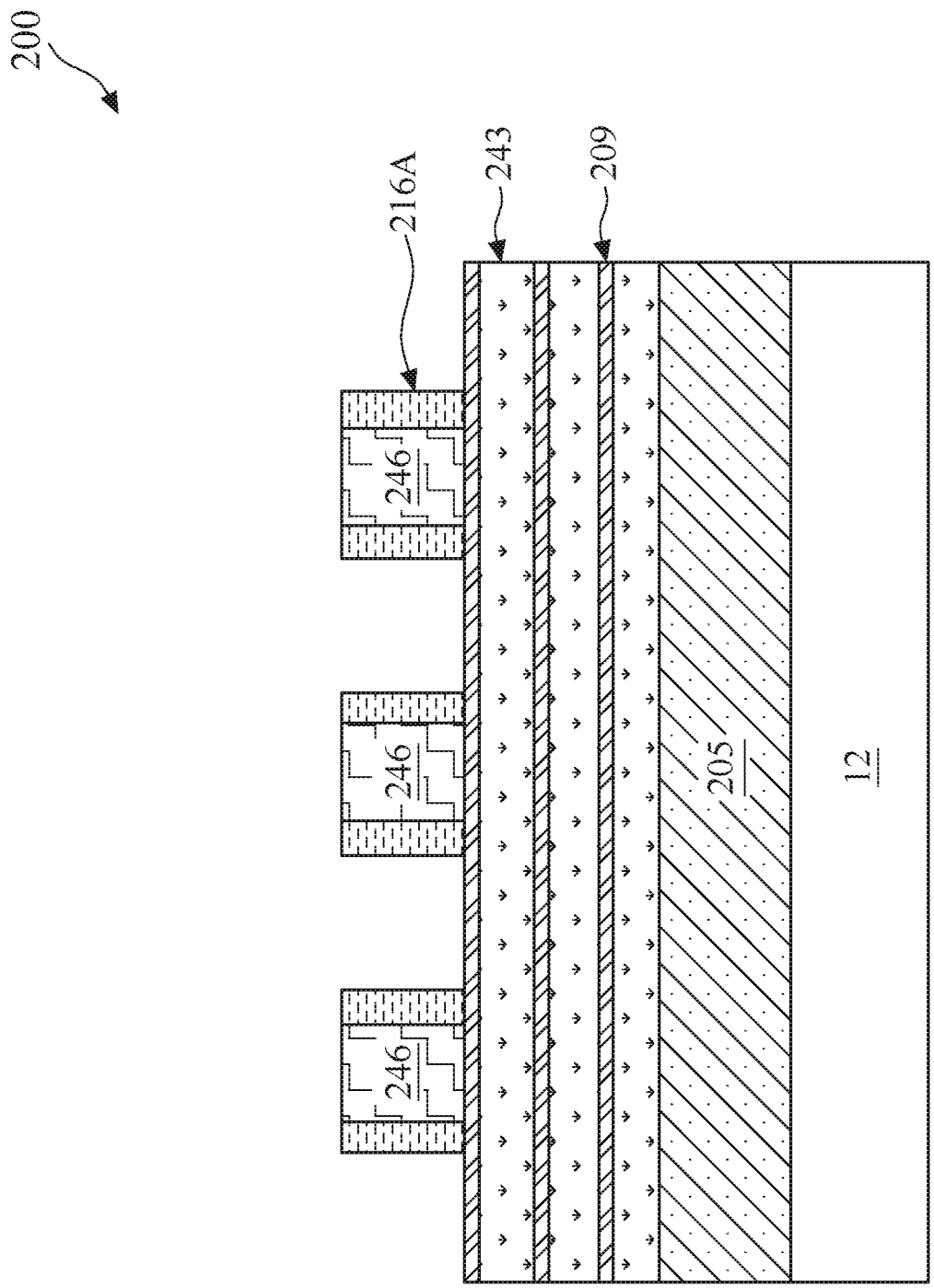
FIGS. 8A, 9, 10, 11, 12, 13A, 14A, 15A, 16A, 17A, 18A, and 19A are cross-sectional views of the IC device of FIG. 7 taken along line DD' according to various aspects of the present disclosure.
Figure 8B:
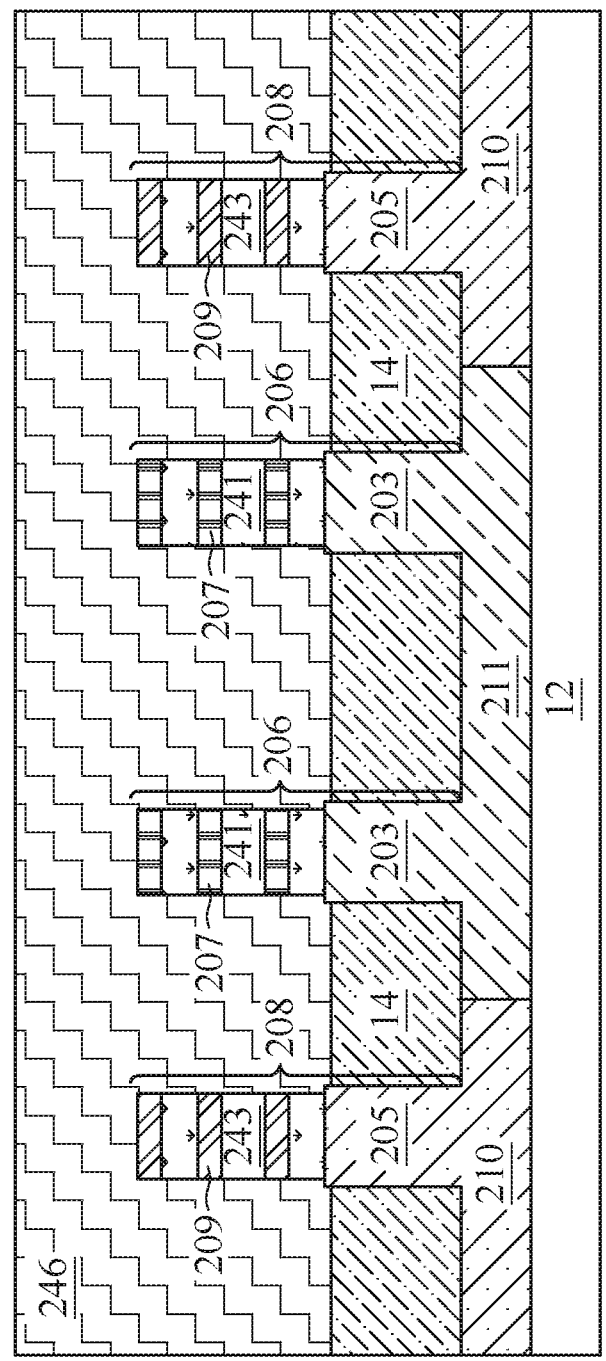
FIGS. 8B, 13B, 14B, 15B, 16B, 17B, 18B, and 19B are cross-sectional views of the IC device of FIG. 7 taken along line EE' according to various aspects of the present disclosure.

Operations 402-410 of the method 400 are discussed in reference to FIGS. 7, 8A, and 8B collectively. At operation 402, the method 400 provides a workpiece, such as the IC structure 100, that includes the substrate 12 and various doped regions (e.g., the n-wells 210 and p-wells 211) formed in or over the substrate 12. In the present embodiments, the substrate 12 includes silicon. Alternatively or additionally, the substrate 12 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. In some embodiments, the substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, other suitable methods, or combinations thereof.

Each n-well 210 may be doped with an n-type dopant, such as phosphorus, arsenic, other n-type dopants, or combinations thereof. Each p-well 211 may be doped with a p-type dopant, such as boron, indium, other p-type dopants, or combinations thereof. In some embodiments, the substrate 12 includes doped regions formed with a combination of p-type dopants and n-type dopants. The various doped regions can be formed directly on and/or in the substrate 12 providing, for example, a p-well structure, an n-well structure, a dual-well structure, a raised structure, or combinations thereof. Each of the various doped regions may be formed by performing an ion implantation process, a diffusion process, other suitable doping processes, or combinations thereof.

At operation 404, the method 400 forms a multi-layer stack of semiconductor materials (hereafter referred to as the "multi-layer stack" for short) over the substrate 12. In the present embodiments, the p-type fins 206 and the n-type fins 208 are formed from the multi-layer stack at subsequent operations of the method 400. In the present embodiments, the multi-layer stack includes alternating layers of a first semiconductor material (e.g., epitaxially grown Si-containing layers 207 and 209 that are substantially free of Ge) and a second semiconductor material (e.g., epitaxially grown SiGe-containing layers 241 and 243) grown in a series of epitaxy processes. The epitaxy process may include CVD deposition techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors, which interact with the composition of the underlying material layers. In some examples, the layers of the multi-stack may be provided in the form of nanosheets, nanowires, or nanorods. Subsequent processing may remove the second semiconductor layers (e.g., the SiGe-containing layers 241 and 243), leaving behind the first semiconductor layers (e.g., the Si-containing layers 207 and 209) separated by openings. Such a process, which will be discussed in detail below, may be referred to as the "wire release process" or "sheet formation process," depending upon the configuration of the layers in the multi-layer stack. In the present embodiments, the remaining stack of Si-containing layers 207 and 209 become the channel layers configured to form a NS NFET (202A or 202B) and a NS PFET (204A or 204B), respectively, in the device 200, and the removed SiGe-containing layers 241 and 243 are hereafter referred to as the non-channel layers.

At operation 406, the method 400 forms the p-type fins (or p-type fin active regions) 206 and the n-type fins (or n-type fin active regions) 208 from the multi-layer stack. Accordingly, the semiconductor fins of the present embodiments include alternating layers of Si (207 or 209) and SiGe (241 or 243) as discussed above. In some embodiments, the device 200 additionally includes semiconductor fins (not depicted herein) having a single semiconductor material rather than alternating layers of different semiconductor materials. The p-type fins 206 and the n-type fins 208 may be fabricated by directly patterning and subsequently etching the multi-layer stack having alternating layers of epitaxially grown Si- and SiGe-containing layers. The fabrication process may include forming a masking element including a photoresist layer, lithographically patterning the masking element, and subsequently etching the multi-layer stack (and portions of the substrate 12) using the patterned masking element as an etch mask. The etching process may include dry etching, wet etching, reactive ion etching (RIE), other suitable processes, or combinations thereof. The resulting p-type fins (or fin active regions) 206 and the n-type fins 208 may be doped with various dopants consistent with desired design requirements.

Additionally or alternatively, other embodiments of methods for forming p-type fins 206 and the n-type fins 208 may also be suitable. For example, the multi-layer stack (and the substrate 12) may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the multi-layer stack to form the p-type fins 206 and the n-type fins 208.

At operation 408, the method 400 forms the isolation structures 14 to insulate various components formed over the substrate 12. The isolation structures 14 may include STI, field oxide, LOCal oxidation of silicon (LOCOS), other suitable features comprising silicon oxide, silicon nitride, silicon oxynitride, other suitable dielectric materials, or combinations thereof. The isolation structures 14 may be formed by any suitable method. In some embodiments, the isolation structures 14 are formed by filling trenches formed between the semiconductor fins in the multi-layer stack with a dielectric material, followed by applying a chemical mechanical planarization (CMP) process and an etch-back process. In some embodiments, the isolation structures 14 are formed by depositing a dielectric material over sidewalls of the p-type fins (or fin active regions) 206 and the n-type fins 208 without completely filling the trenches between them. The isolation structures 14 may include a multi-layer structure, for example, having one or more thermal oxide liner layers.

At operation 410, still referring to FIGS. 7-8B, the method 400 forms a dummy gate stack (or a placeholder gate) 246 over the p-type fins 206 and the n-type fins 208. The dummy gate stack 246 may include, for example, an IL (including, for example, silicon oxide) formed over the p-type fins 206 and the n-type fins 208 and a dummy gate electrode layer (including, for example, polysilicon) formed over the IL. After forming other components (e.g., the n-type S/D features 214N and the p-type S/D features 214P) of the device 200, portions of the dummy gate stack 246 (e.g., the dummy gate electrode layer) is removed to form a gate trench in which at least a gate dielectric layer (e.g., the gate dielectric layer 234) and a metal gate electrode (e.g., including the WFM layers 236A-236D and the metal fill layer 238) are subsequently formed to complete the fabrication of the gate stacks 231 and 232. Various material layers of the dummy gate stack 246 may be first deposited as a blanket layer over the semiconductor fins and subsequently patterned, followed by one or more etching process, to form the dummy gate stack 246 in a desired configuration in the device 200. The various material layers of the dummy gate stack 246 may be formed by any suitable method, such as chemical oxidation, thermal oxidation, CVD, atomic layer deposition (ALD), physical vapor deposition (PVD), electroplating, other suitable methods, or combinations thereof.

The method 400 proceeds to forming the top gate spacers 216A on sidewalls of the dummy gate stack 246 at operation 410. The top gate spacers 216A may be a single-layer structure or a multi-layer structure and may include any suitable dielectric material discussed above with respect to FIG. 4. The top gate spacers 216A may be formed by first depositing at least one spacer layer over the device 200 and subsequently performing an anisotropic etching process to the spacer layer, leaving behind the top gate spacers 216A on the sidewalls of the dummy gate stack 246.

Figure 10:
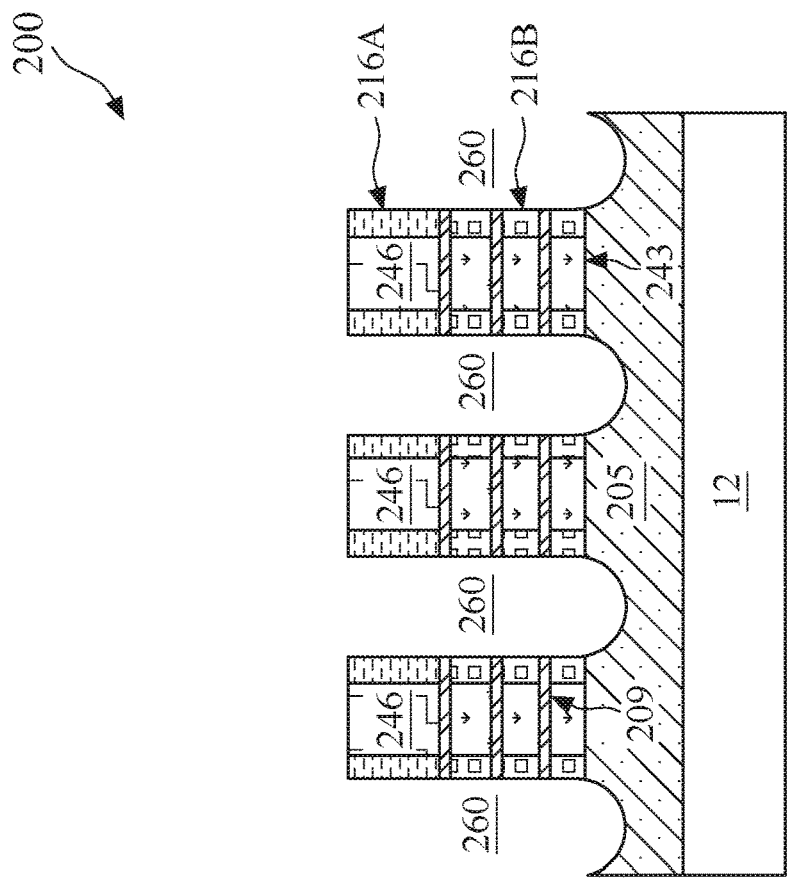
Figure 9:
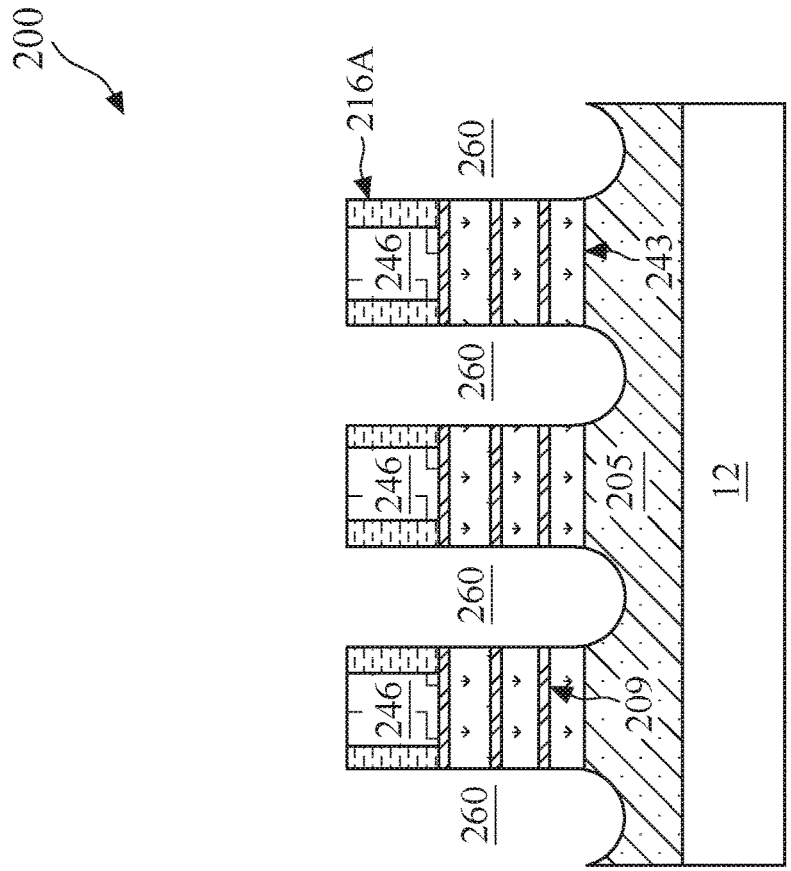

At operation 412, referring to FIGS. 9 and 10, the method 400 forms the inner gate spacers 216B on portions of the multi-layer stack exposed in S/D recesses 260. Referring to FIG. 9, the method 400 first removes portions of the n-type fin 208 (and the p-type fin 206) to form the S/D recesses 260 and expose sidewalls of the multi-layer stack therein. Subsequently, the method 400 forms the inner gate spacers 216B on the exposed sidewalls of the non-channel layers 243 (and the non-channel layers 241). In some embodiments, forming the inner gate spacers 216B includes selectively removing portions of the non-channel layers 243 without removing (or substantially removing) the channel layers 209 to form openings (not depicted), depositing a spacer layer in the openings, and performing one or more etch-back process to form the inner gate spacers 216B in the openings (FIG. 10). The inner gate spacers 216B may be a single-layer structure or a multi-layer structure and may include any suitable dielectric material discussed above with respect to FIG. 4.

Figures 11, 12:
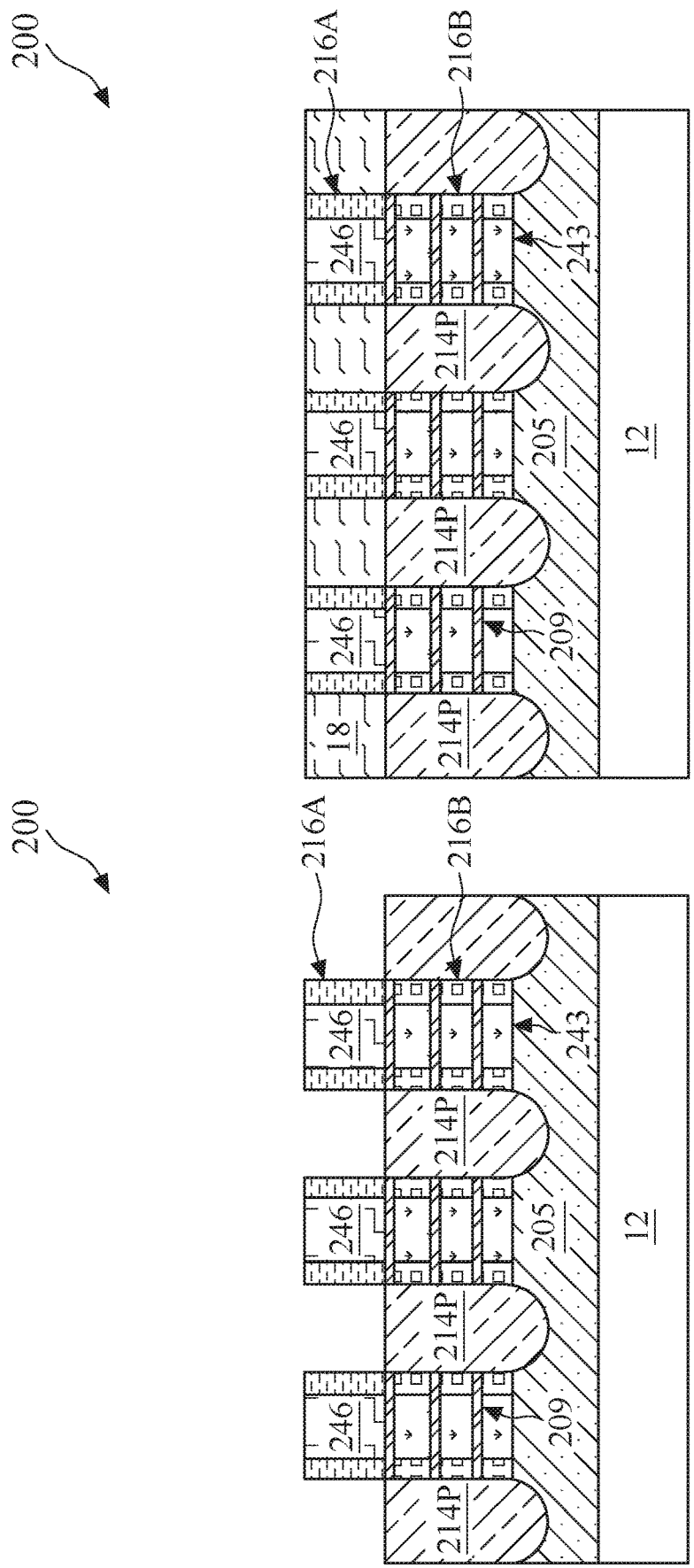

At operation 414, referring to FIG. 11, the method 400 forms the p-type S/D features 214P in the S/D recesses 260. The composition of the p-type S/D feature 214P has been discussed above with respect to FIG. 5. In the present embodiments, one or more epitaxy growth processes similar to those discussed above with respect to forming the multi-stack layer are performed to grow the p-type S/D features 214P. In some embodiments, the p-type S/D features 214P includes an epitaxial material, such as epi SiGe, doped in-situ by adding a suitable dopant during the epitaxy growth process. In some embodiments, the epitaxial material is doped by an ion implantation process after performing a deposition process. In some embodiments, annealing processes are performed to activate dopants in the p-type S/D features 214P and/or other S/D regions, such as HDD regions and/or LDD regions.

Figure 13A:
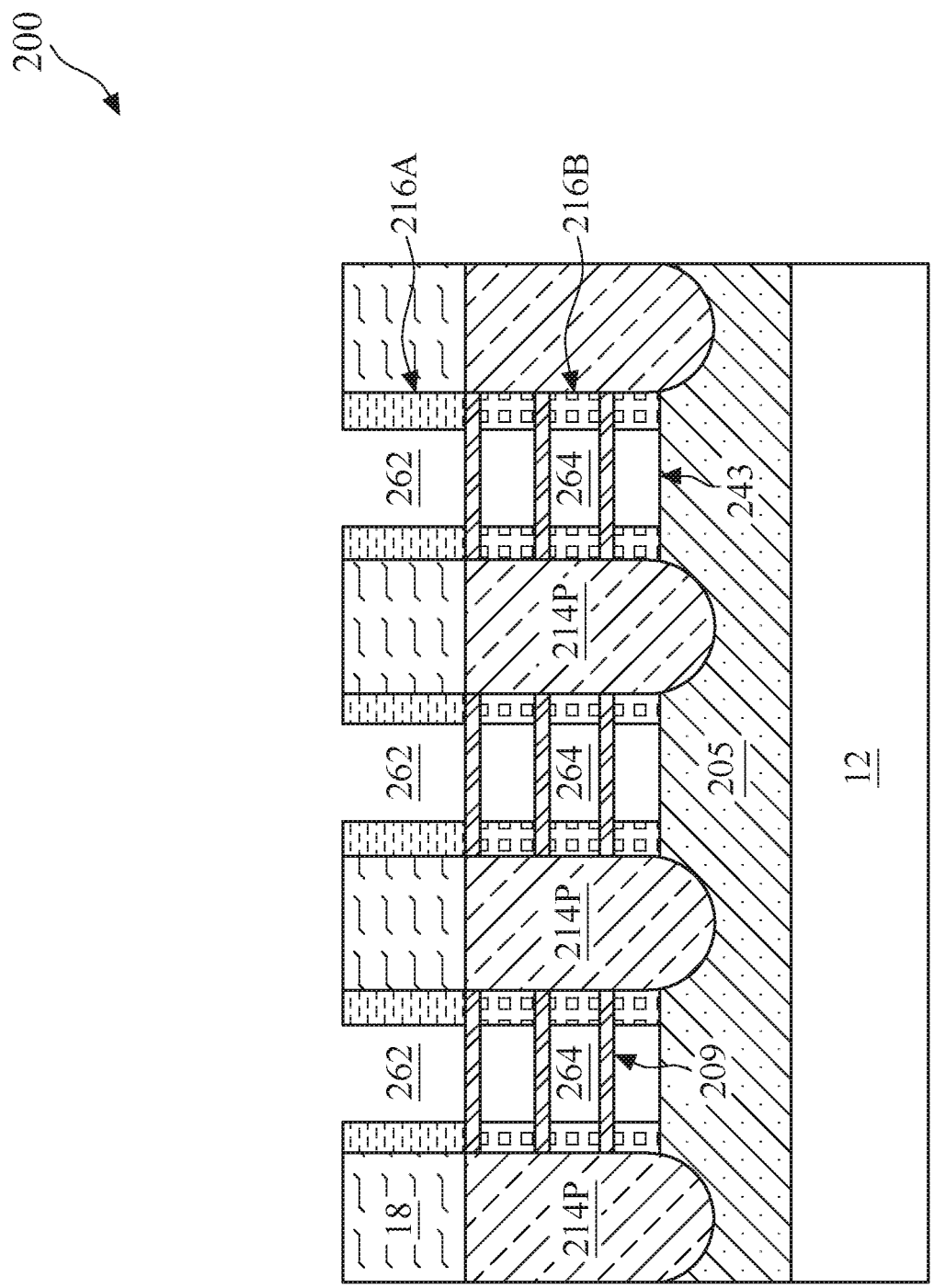
Figure 13B:
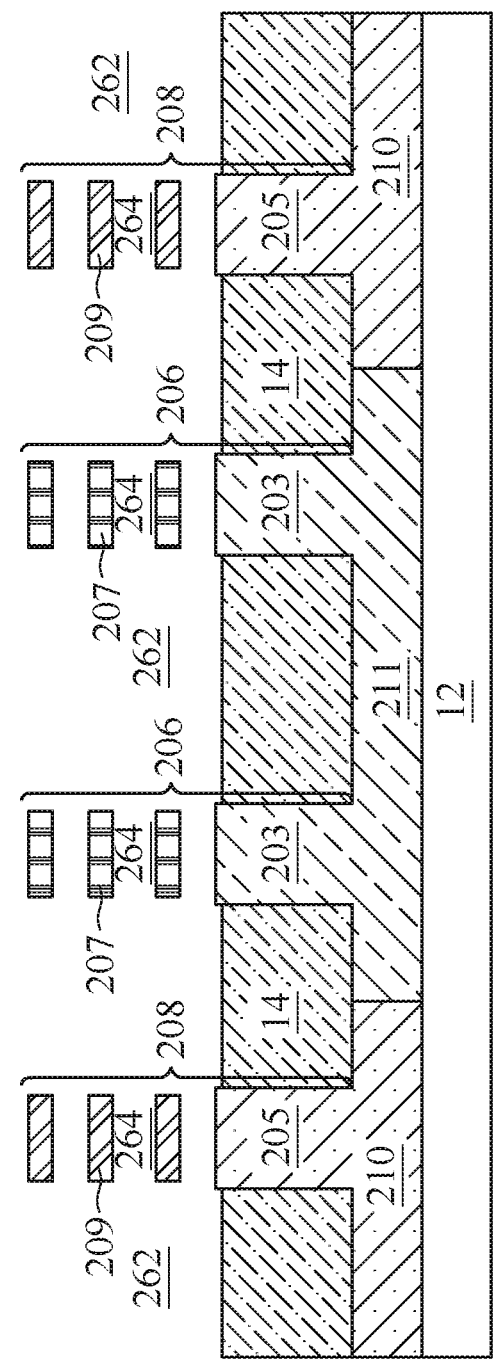

At operation 416, referring to FIGS. 12, 13A, and 13B, the method 400 removes the dummy gate stack 246 to form a gate trench 262 between the top gate spacers 216A. In the present embodiments, referring to FIG. 12, forming the gate trench 262 includes forming an ILD layer 18 over the p-type S/D features 214P. The ILD layer 18 may have a composition similar to that of the ILD layer 20 discussed above with respect to FIG. 4. For example, the ILD layer 18 may include a low-k dielectric material, silicon oxide, doped silicate glass, other suitable materials, or combinations thereof, and may be formed by any suitable method, such as spin-on-glass or flowable CVD (FCVD). A top surface of the ILD layer 18 may be planarized using one or more CMP process. Thereafter, referring to FIGS. 13A and 13B, the method 400 proceeds to removing the dummy gate stack 246 from the device 200 by any suitable method, such as a dry etching process and/or a wet etching process, resulting in the gate trench 262 between the top gate spacers 216A.

At operation 418, still referring to FIGS. 13A and 13B, the method 400 removes the non-channel layers 243 (e.g., the SiGe-containing layers) from the multi-layer stack by one or more etching process, such as a dry etching process and/or a wet etching process, to leave behind the channel layers 209 (e.g., the Si-containing layers). In other words, after removing the non-channel layers 243, openings 264 are inserted between or interleaved with the stack of channel layers 209. In the present embodiments, the one or more etching process selectively remove the non-channel layers 243 without removing or substantially removing the channel layers 209, respectively.

At operation 420, referring to FIGS. 14A-17B collectively, the method 400 forms a gate stack 230, which is subsequently separated or cut at operation 424 (see FIGS. 19A and 19B) into the gate stacks 231 and 232 as discussed above. In the present embodiments, referring to FIG. 6B, forming the gate stack 230 is implemented by the method 500. Structures and compositions of various components of the gate stack 230 consistent with those of the gate stacks 231 and 232 share the same reference numerals as those provided above with respect to FIG. 4 and will thus be omitted for the discussion of the method 500 below for purposes of simplicity.

Figure 14A:
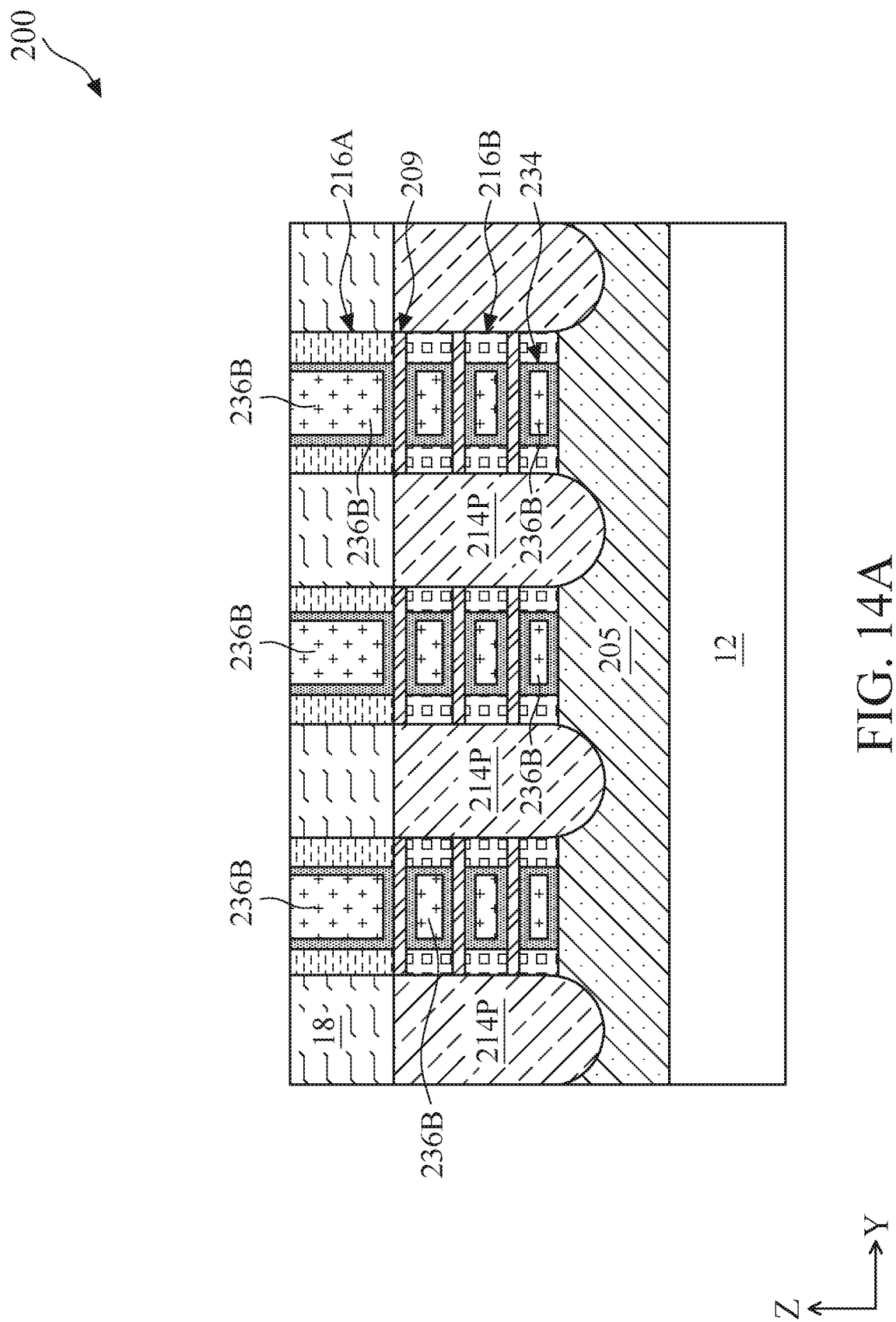
Figure 14B:
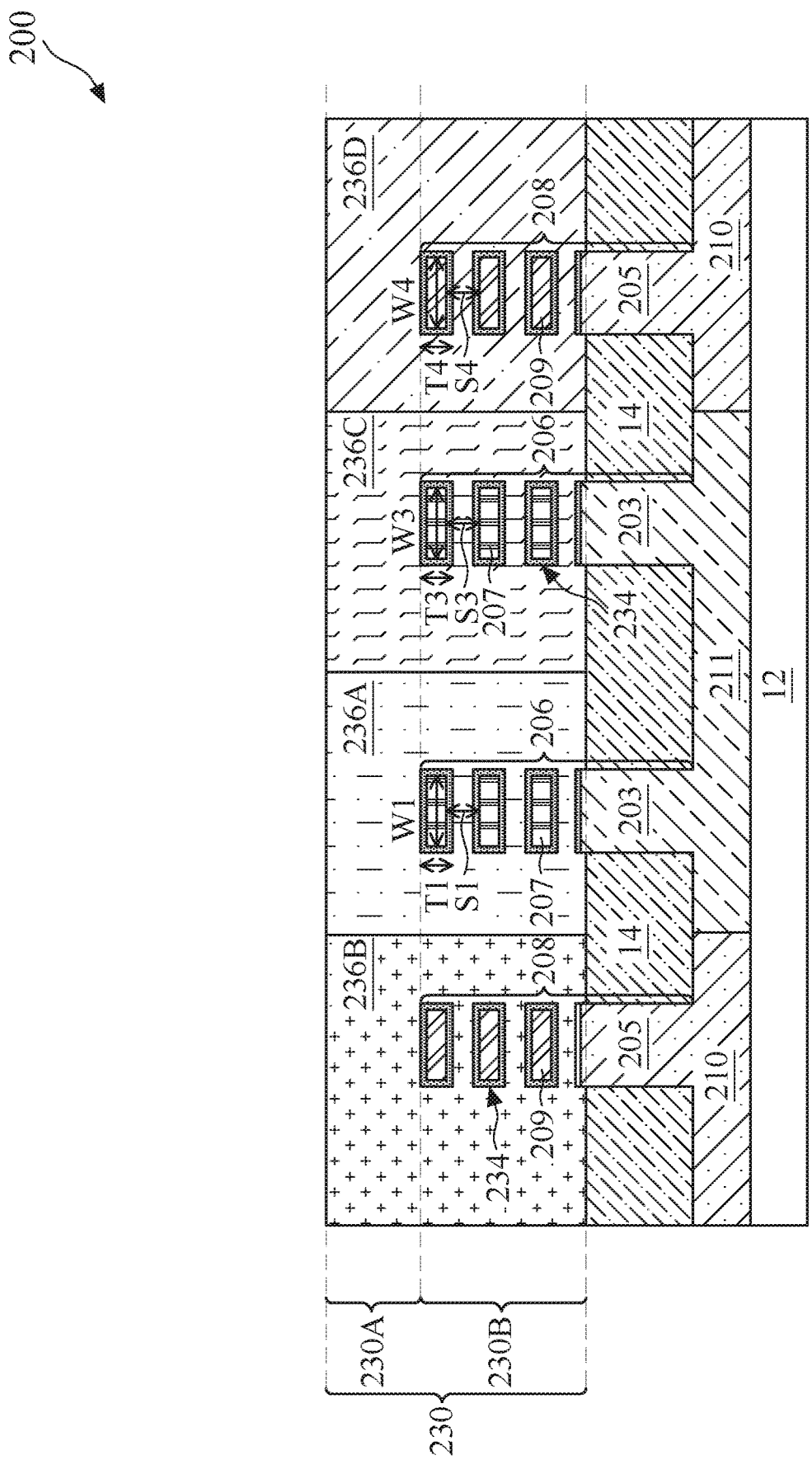

Referring to FIGS. 14A and 14B, the method 500 at operation 502 first forms the gate dielectric layer 234 in the gate trench 262 and the openings 264, such that the gate dielectric layer 234 is deposited on surfaces of each channel layer 207 and 209 as well as the top surfaces of the base fins 203 and 205. The gate dielectric layer 234 may be formed by ALD, CVD, other suitable processes, or combinations thereof. In the present embodiments, the gate dielectric layer 234 is deposited conformally on each channel layer 207 and 209. In some embodiments, the method 500 first forms an IL (not depicted) over the channel layers 207 and 209 before depositing the gate dielectric layer 234.

Still referring to FIGS. 14A and 14B, the method at operation 504 forms the WFM layers 236A-236D over the gate dielectric layer 234. In the present embodiments, forming the WFM layers 236A-236D completely fills the gate trench 262 and the openings 264, such that the outer sidewalls of the WFM layers 236A and 236D define the sidewalls of the gate stack 230 when viewed along a lengthwise direction of the gate stack 230 (FIG. 14B). In some embodiments, the method 500 forms the WFM layers 236A-236D via a series of deposition and patterning processes, such that the composition, and the work function, of each of the WFM layers 236A-236D is suitable for tuning the $V_t$ of their respective NS FETs. The deposition and patterning processes may be repeated if the WFM layers 236A-236D each include more than one WFMs. Of course, the present embodiments do not limit the order in which the WFM layers 236A-236D are formed. For example, the method 500 may form the WFM layer 236B first and proceed to patterning the WFM layer 236B and forming the WFM layer 236A subsequently. One or more CMP process may be implemented thereafter to planarize the top surface of the WFM layers 236A-236D. Each of the WFM layers 236A-236D may be deposited by ALD, CVD, PVD, other suitable deposition processes, or combinations thereof.

Figure 15A:
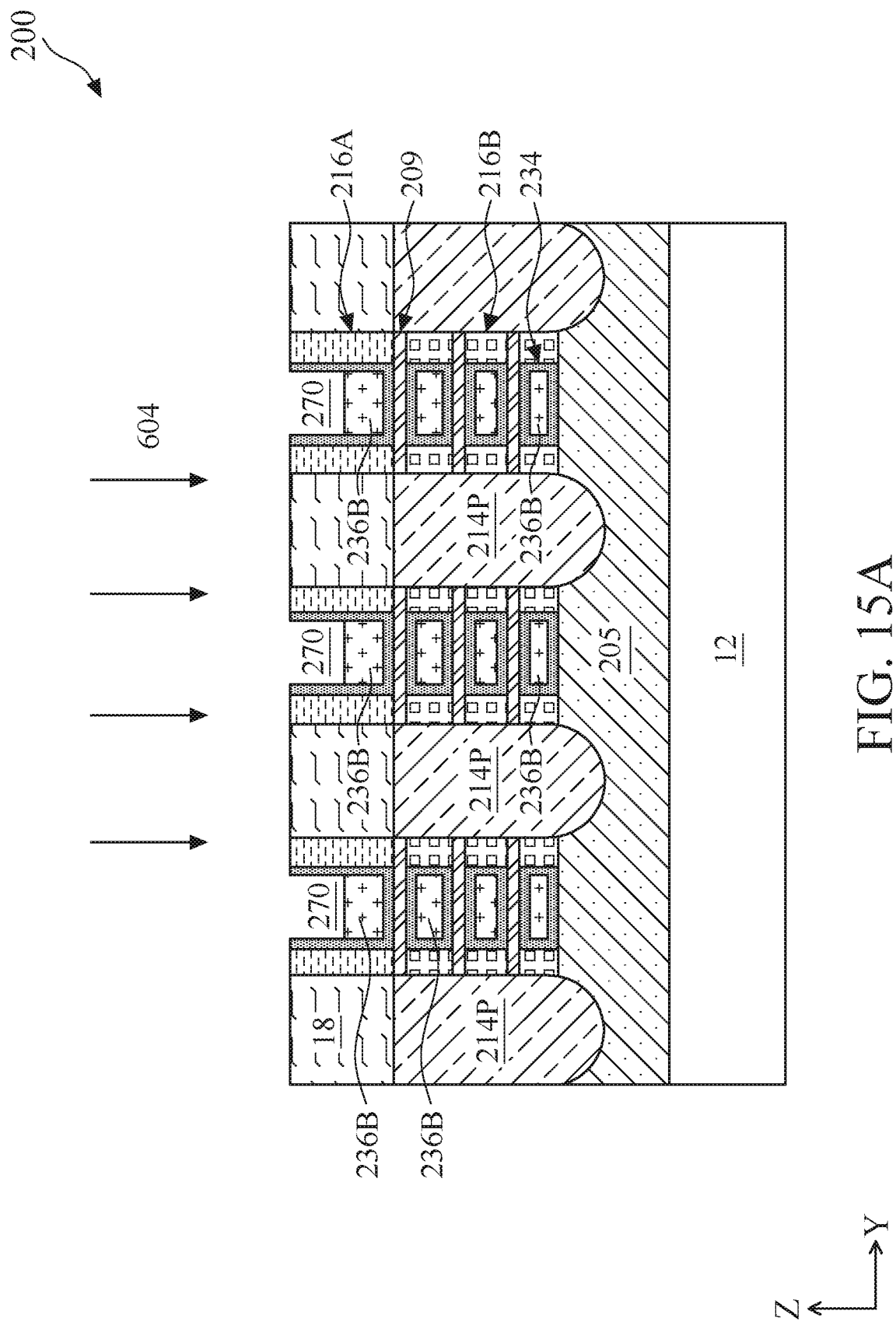
Figure 15B:
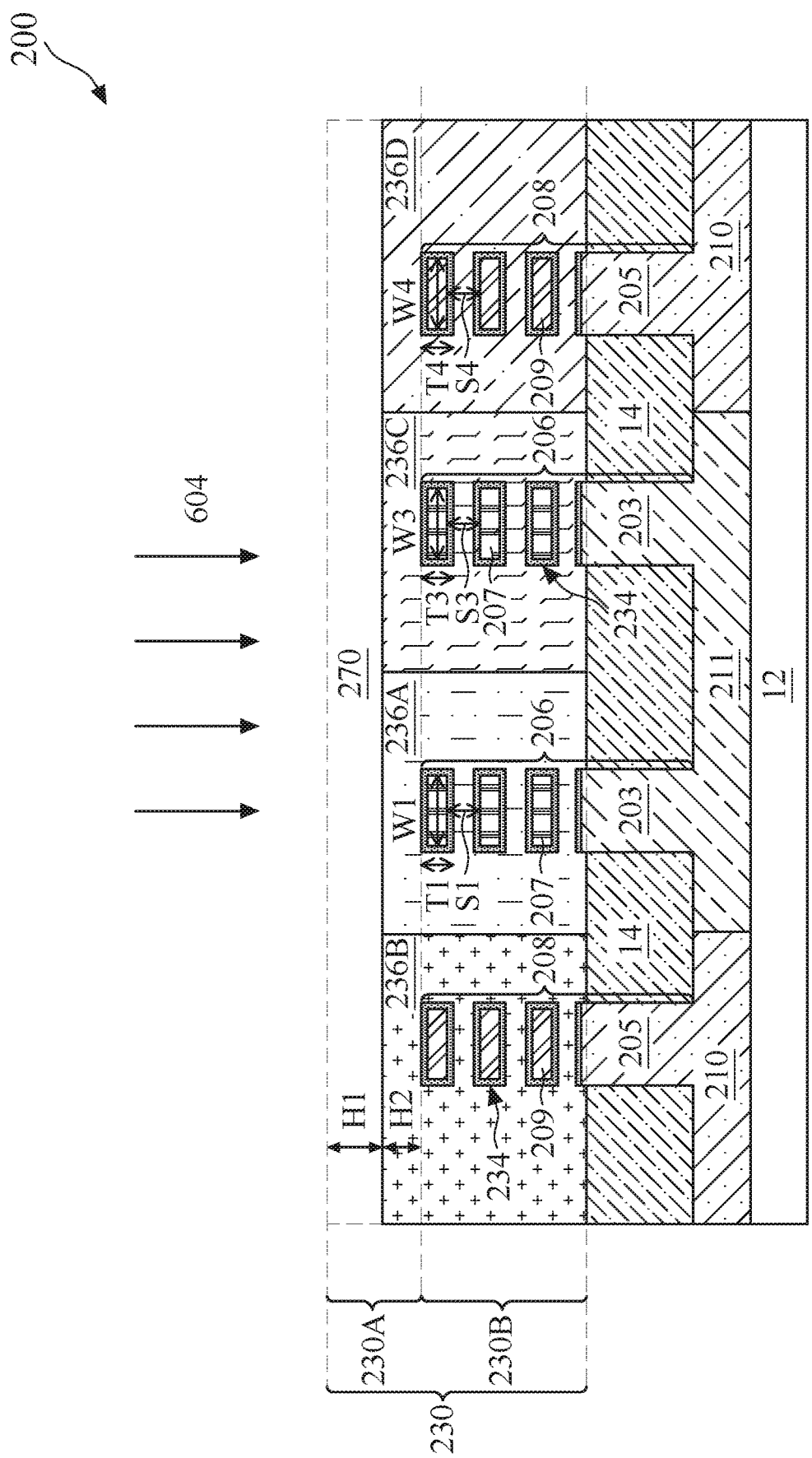

Now referring to FIGS. 15A and 15B, the method 500 at operation 506 recesses the WFM layers 236A-236D to form a trench 270. In the present embodiments, recessing the WFM layers 236A-236D does not completely remove portions of the WFM layers 236A-236D disposed over the channel layers 207 and 209. Defining the trench 270 to have a depth H1 (which also defines the thickness of the metal fill layer 238) and the remaining portions of the WFM layers 236A-236D to have the thickness H2 as discussed above, the present embodiments provide that H2 is greater than 0. In some examples, H2 may be less than H1; though the present embodiments are not limited thereto. The WFM layers 236A-236D may be recessed by an etching process 604, which may be a dry etching process and/or a wet etching process, using an etchant including a fluorine-based etchant (e.g., $CF_4$, $SF_6$), a chlorine-based etchant (e.g., $CCl_4$), hydrogen peroxide, an acid (e.g., $H_3PO_4$, $HNO_3$), other suitable etchants, or combinations thereof, where the type of etchants used for the etching process 604 may be selected based on the compositions of the WFM layer 236A-236D. In some embodiments, the depth H1 may be controlled by adjusting various parameters of the etching process 604 including, for example, etching duration.

Figure 16A:
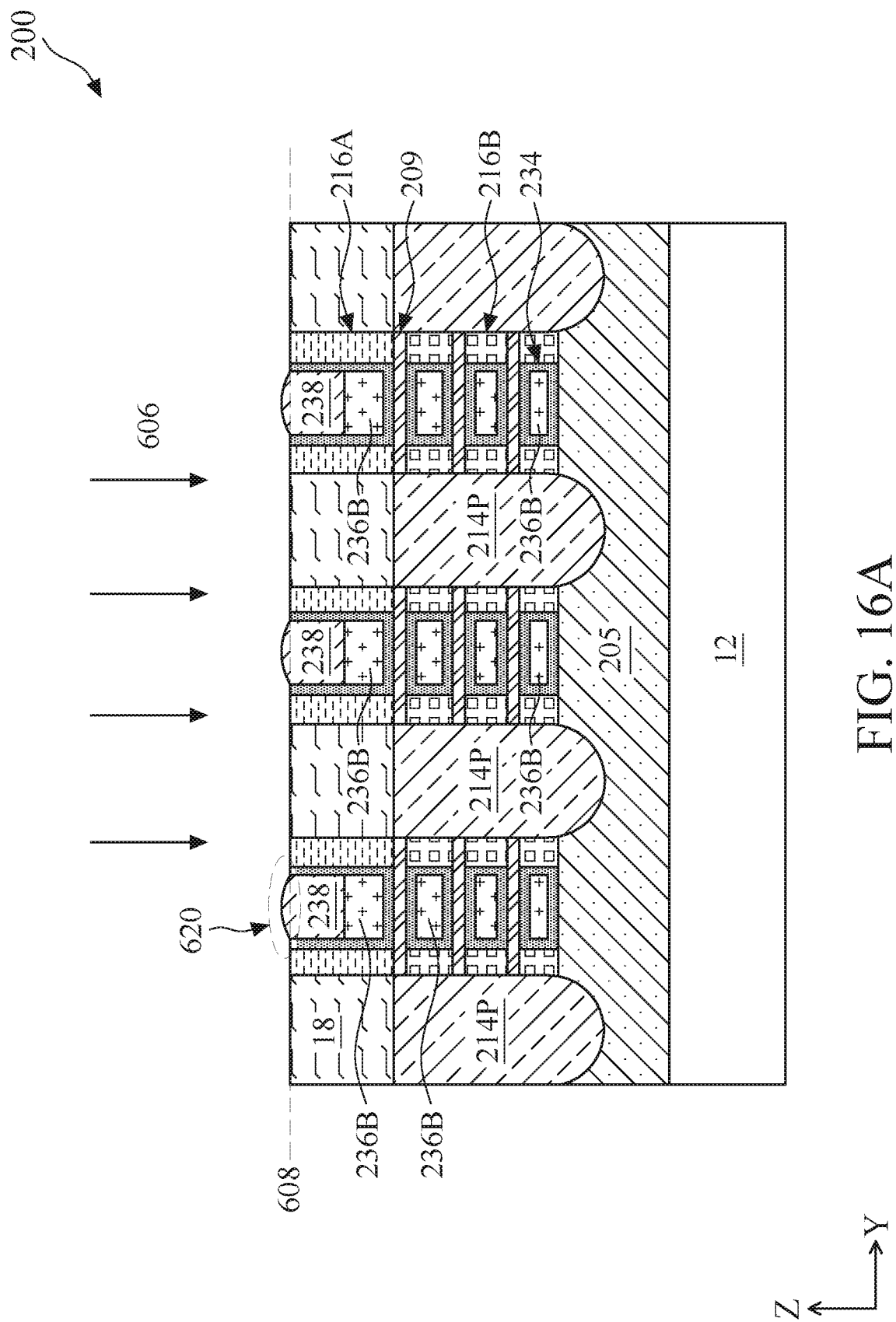
Figure 16B:
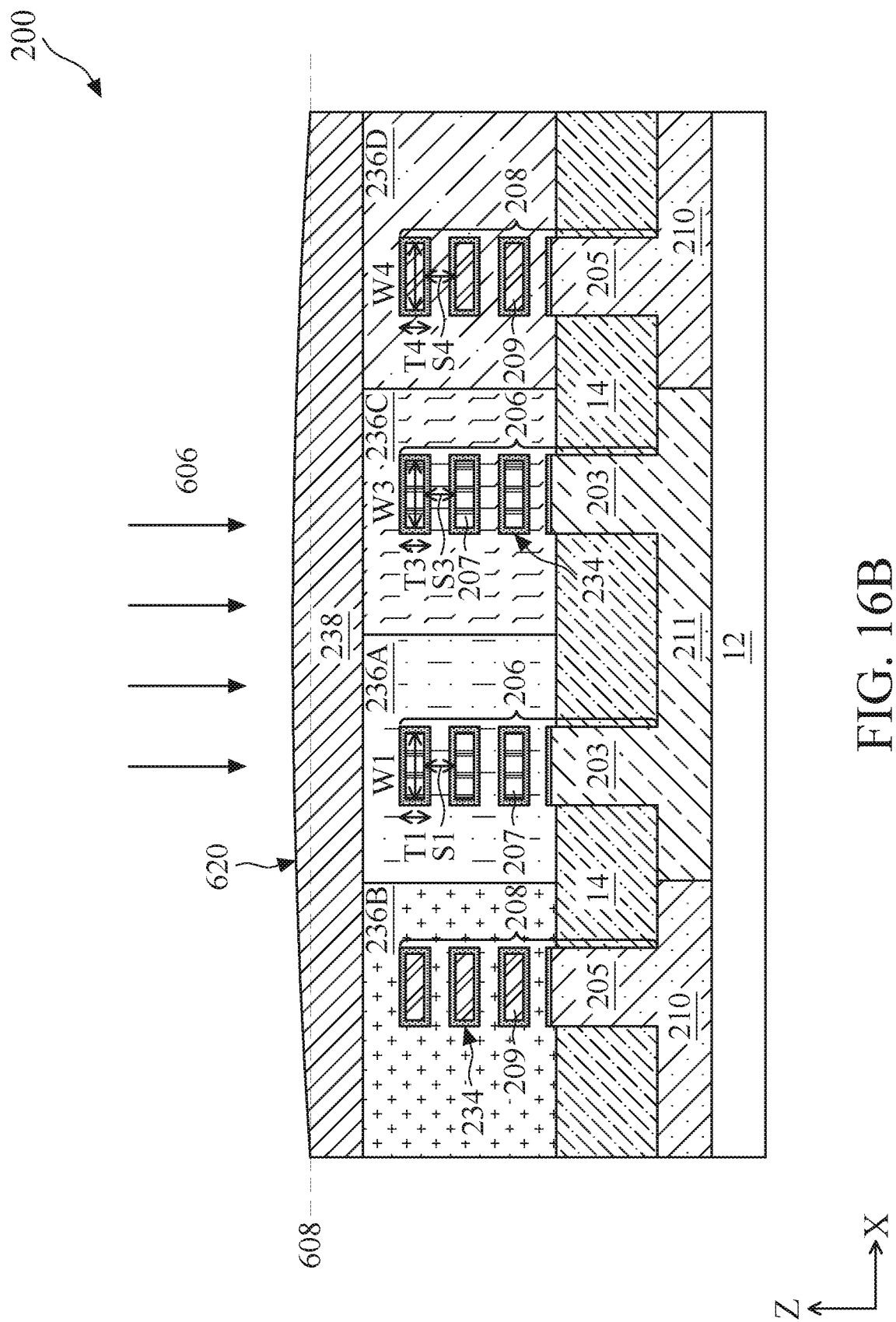
Figure 17A:
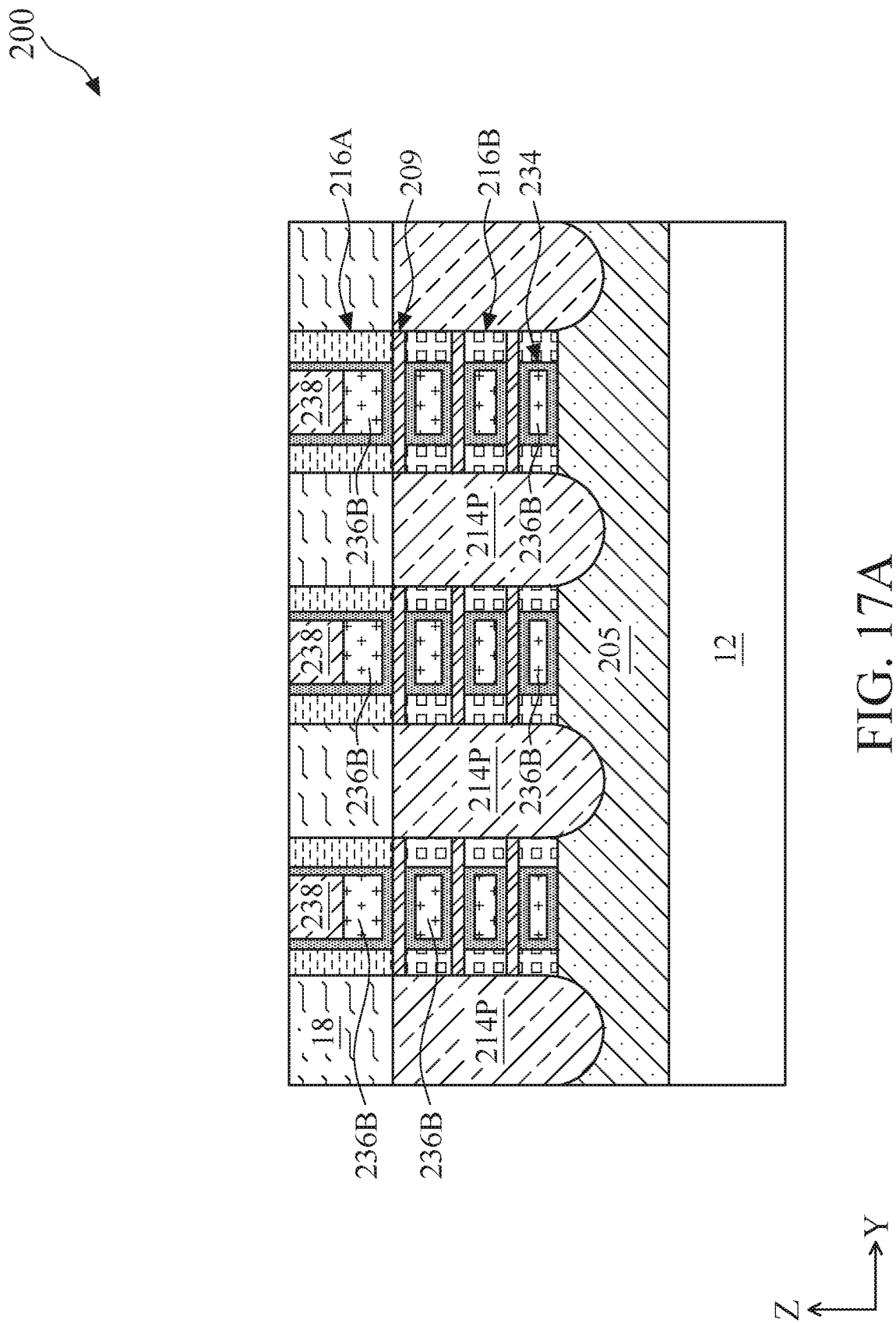
Figure 17B:
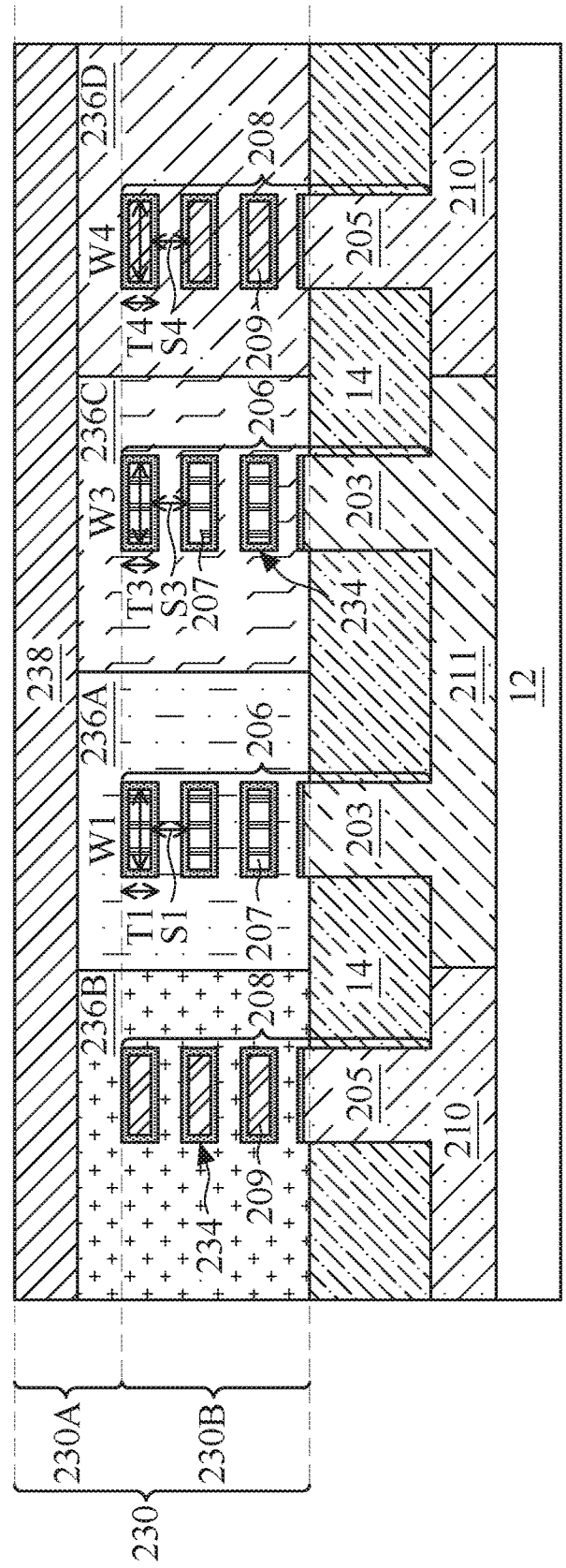
Figure 18A:
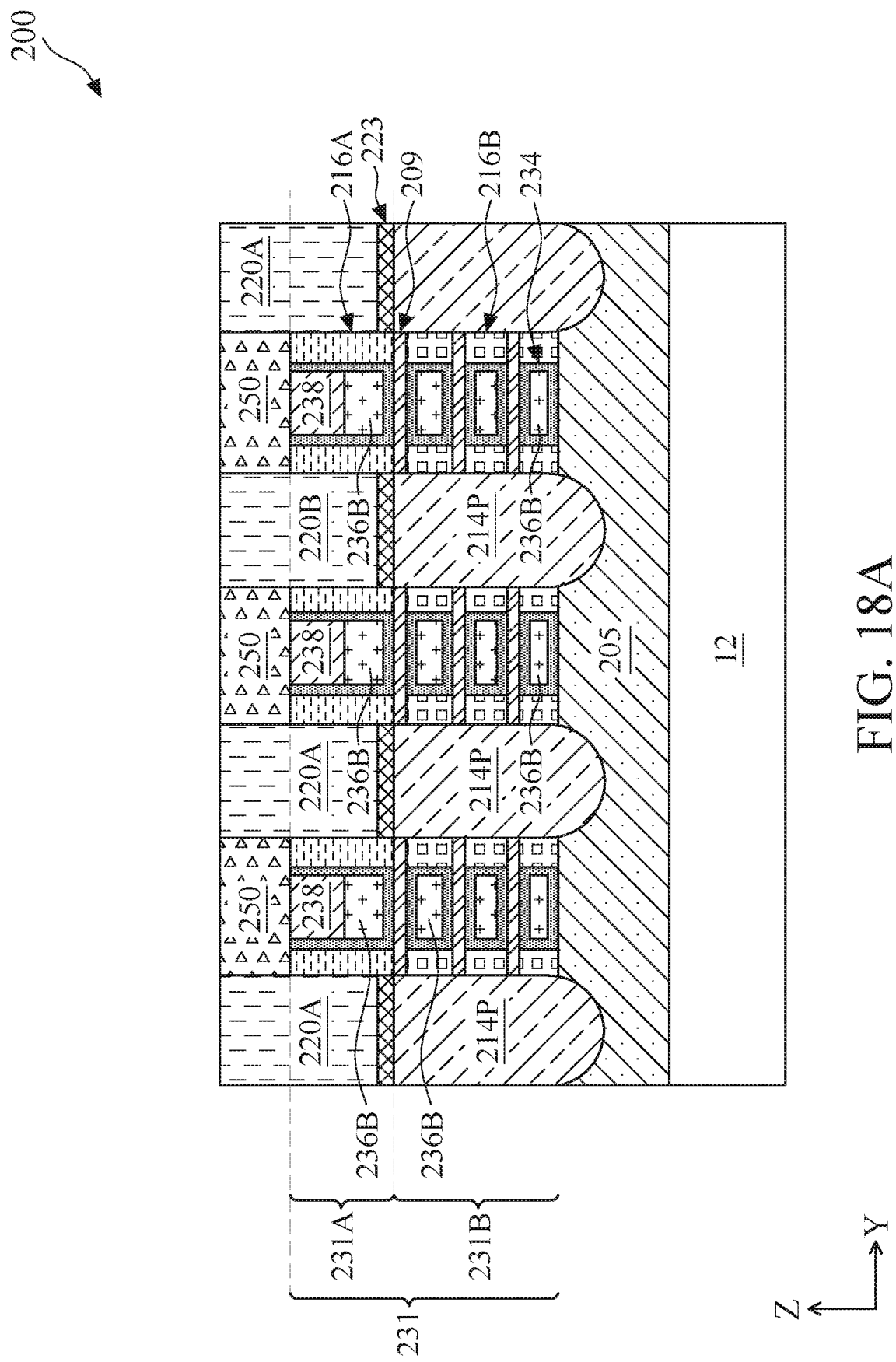
Figure 18B:
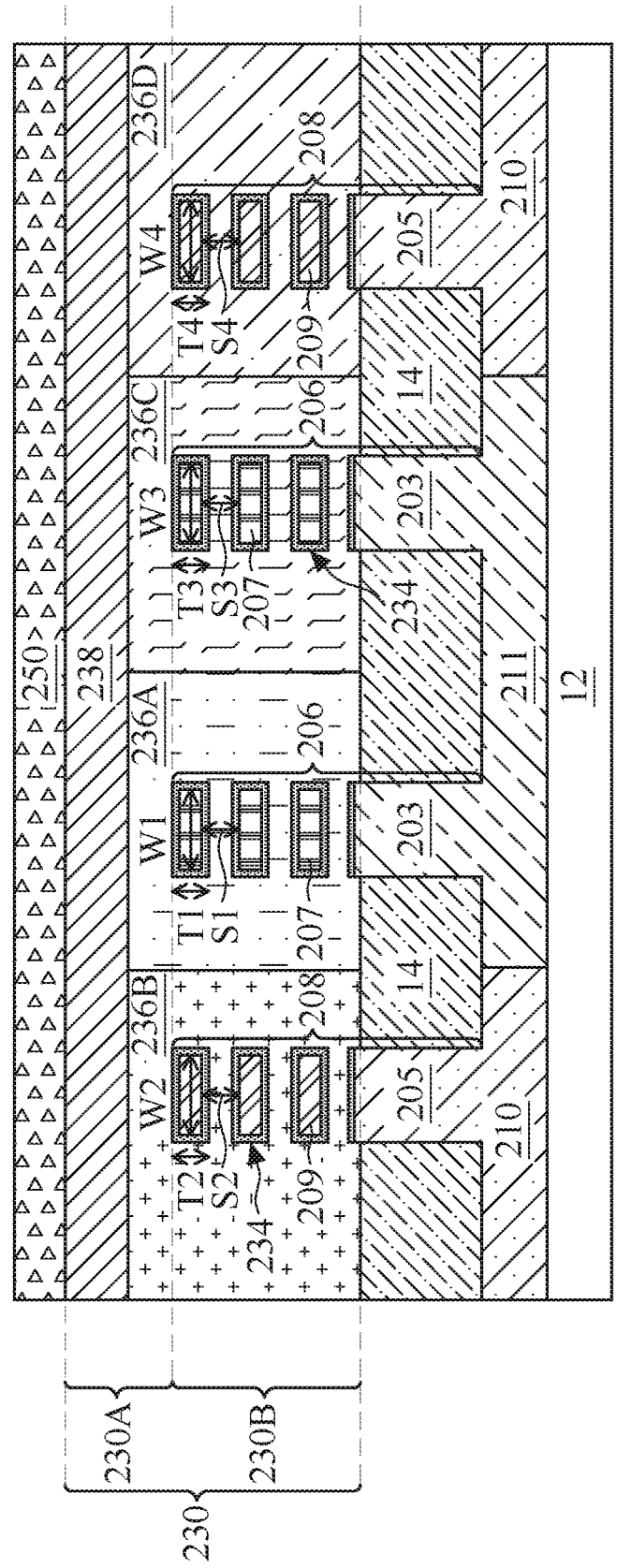

Subsequently, referring to FIGS. 16A-17B, the method 500 at operation 508 forms the metal fill layer 238 in the trench 270, thereby filling the gate trench 262. Referring to FIGS. 16A and 16B, the metal fill layer 238 may be formed by a deposition process 606, which may include CVD, ALD, PVD, plating, other processes, or combinations thereof. In the present embodiments, the method 500 deposits W in the trench 270 to form the metal fill layer 238. In some embodiments, the deposition process 606 is an epitaxial growth process during which the metal fill layer 238 selectively grows from a metal-containing surface, e.g., the WFM layers 236A-236D, rather than from a dielectric-containing surface, e.g., the ILD layer 18 or the top gate spacers 216A. In other words, the deposition process 606 forms the metal fill layer 238 in a substantially bottom-up growth scheme in the trench 270. In some embodiments, such bottom-up growth scheme causes a top portion 620 of the metal fill layer 238 to protrude from a top surface of the ILD layer 18. Accordingly, the method 500 at operation 508 subsequently performs one or more CMP process along line 608 to remove the protruded top portion 620, thereby planarizing the metal fill layer 238 and completing the fabrication of the gate stack 230 as depicted in FIGS. 17A and 17B. In the present embodiments, the metal fill layer 238 and the portions of the WFM layers 236A-236D together constitute the top portion 230A, which is formed over the bottom portion 230B that includes portions of the WFM layers 236A-236D but is free of the metal fill layer 238.

Now turning back to FIG. 6A, at operation 422, the method 400 proceeds to forming the S/D contacts 220A-220E to interconnect various device-level features, such as the n-type S/D features 214N or the p-type S/D features 214P, with the subsequently-formed MLI structures. In the present embodiments, referring to FIGS. 5, 18A, and 18B, the S/D contacts 220A-220E are formed in the ILD layers 18 and 19 (and the ESL 250), and may include any suitable conductive material, such as Cu, W, Ru, Co, Al, other suitable materials, or combinations thereof. Each of the S/D contacts 220A-220E may further include a barrier layer comprising Ti, Ta, TiN, TaN, other suitable materials, or combinations thereof. Forming the S/D contacts 220A-220E may include forming the ILD layer 19 over the ILD layer 18, where the ILD layer 19 is substantially similar to the ILD layer 20 as discussed above, forming the ESL 250 over the ILD layer 19, forming contact openings (not depicted) in the ESL 250, the ILD layer 18, and the ILD layer 19 via a series of patterning and etching processes similar to those discussed above with respect to forming the p-type fins 206 and n-type fins 208, forming the silicide layer 223 over each of S/D features, i.e., the n-type S/D features 214N and the p-type S/D features 214P, and subsequently depositing the conductive material(s) over the silicide layer 223 in the contact openings by PVD, CVD, ALD, plating, other suitable deposition processes, or combinations thereof. The silicide layer 223 may be formed by first depositing a metal layer over each of the S/D features, performing a silicidation process to allow the metal layer to react with the materials of the S/D features, and subsequently removing un-reacted portions of the metal layer to leave behind the silicide layer 223. The silicide layer 223 may include nickel silicide, titanium silicide, cobalt silicide, other suitable silicides, or combinations thereof. Thereafter, any excess conductive material(s) may be removed by a CMP process to planarize a top surface of the S/D contacts 220A-220E.

Figure 19A:
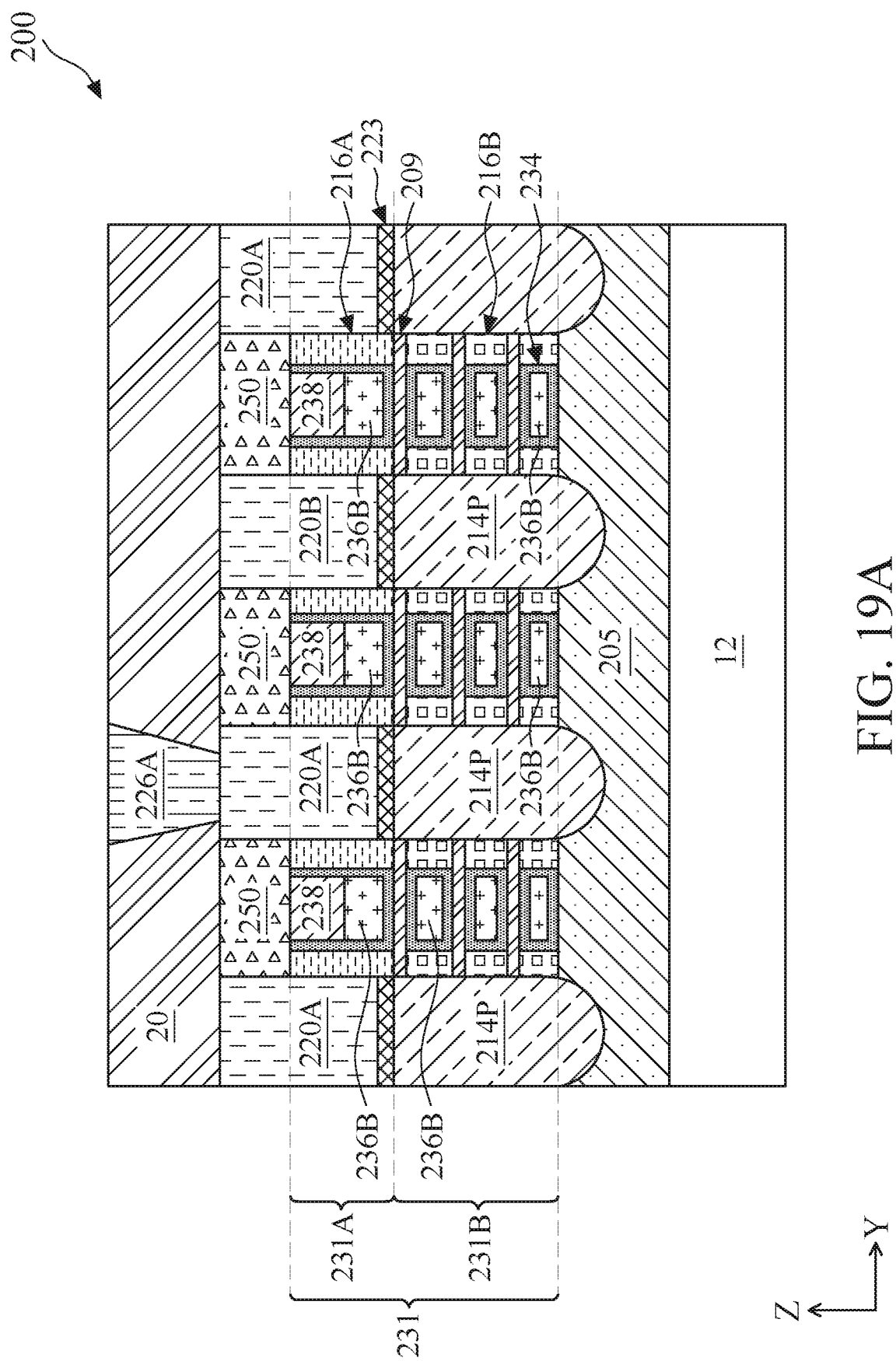
Figure 19B:
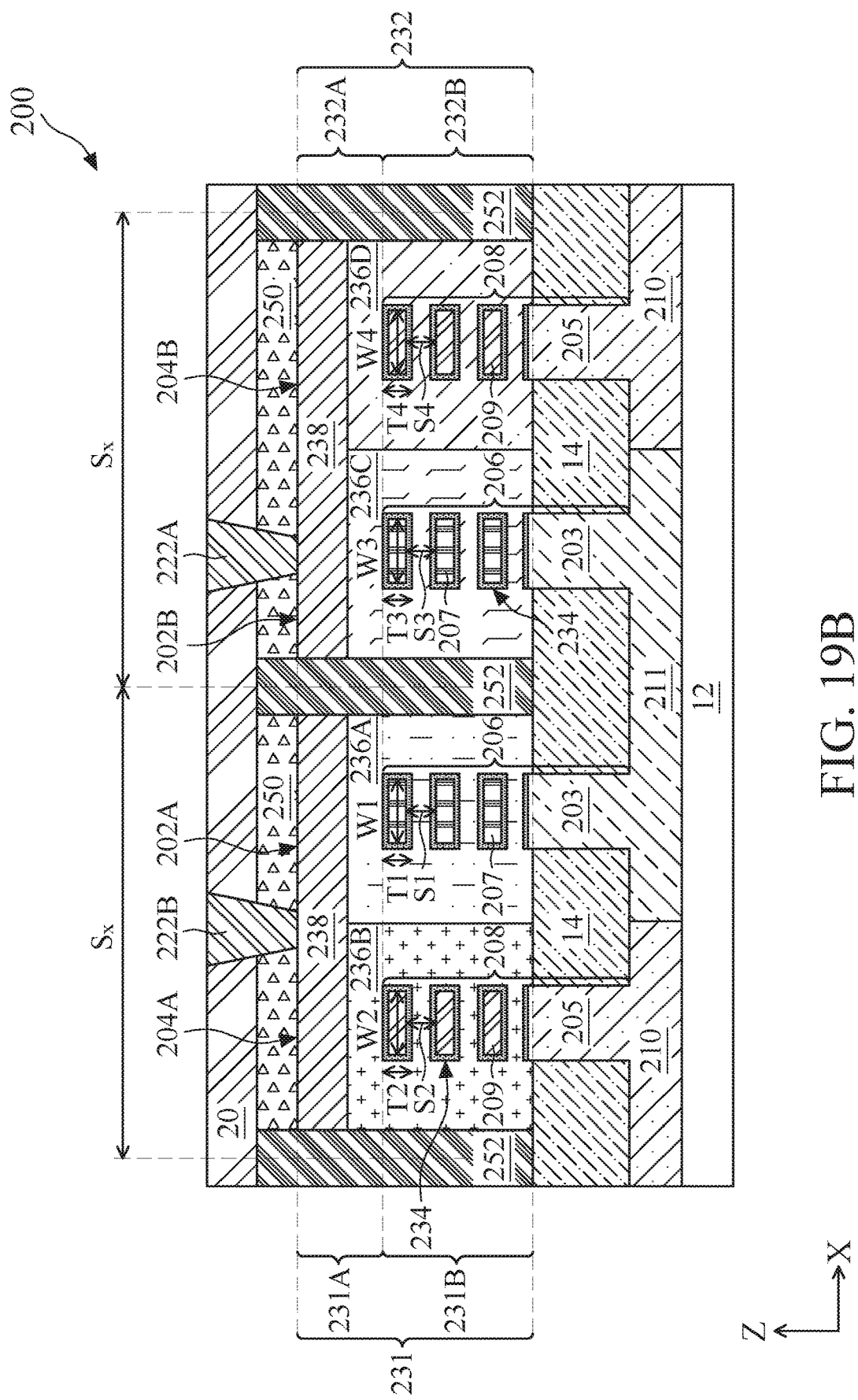

At operation 424, referring to FIGS. 19A and 19B, the method 400 performs additional processing steps including, for example, separating or cutting the gate stack 230 into the gate stacks 231 and 232 as discussed above in reference to FIG. 4 and subsequently forming the MLI structure over the device 200. Cutting the gate stack 230 into two or more shorter gate stacks, e.g., the gate stacks 231 and 232, and inserting the gate isolation features 252 therebetween may include patterning to form trenches (not depicted) in the gate stack 230 where the gate isolation features 252 are desired, filling the trenches with a suitable dielectric material, and subsequently planarizing the top surface of the gate isolation features 252 by one or more CMP process. The gate isolation features 252 may include silicon nitride, silicon carbide, oxygen-doped silicon nitride (SiON), carbon-doped silicon nitride (SiCN), aluminum nitride, other suitable materials, or combinations thereof. In some embodiments, the gate isolation features 252 and the ESL 250 are configured with different compositions. In the depicted embodiments, the gate isolation features 252 are formed at boundaries between adjacent NS CMOSFETs, i.e., between the NS NFET 202A and the NS NFET 202B. The gate isolation features 252 may extend to contact the top surface of the isolation structures 14 as depicted in FIG. 19B. Alternatively, the gate isolation features 252 may extend to below the top surface of the isolation structures 14.

The MLI structure may include metal layers, dielectric layers, and interconnect structures, such as the gate contacts 222A and 222B, configured to electrically couple various components (e.g., gate stacks, S/D features, etc.) of the device 200 with additional devices and components to ensure the proper performance of the IC structure 100. Forming vertical interconnect structures may include forming a dielectric layer, such as the ILD layer 20, over the gate stacks 231 and 232 and subsequently patterning the ILD layer 20 to form contact openings similar to those formed for the S/D contacts 220A-220E discussed above. Of course, additional vertical interconnect structures, such as vias 226A and 226B discussed above in reference to FIGS. 2, 4, and 5, as well as horizontal interconnect structures, metal layers, and dielectric layers may also be formed in the MLI structure over the device 200 by any suitable methods.

Although not intended to be limiting, one or more embodiments of the present disclosure provide many benefits to a semiconductor device and the formation thereof. For example, the present embodiments provide a semiconductor structure including a metal gate stack engaged with a stack of channel layers to form an NS FET, where a top portion of the metal gate stack disposed over the stack of channel layers differs from a bottom portion of the metal gate stack interleaved with the stack of channel layers in composition. In the present embodiments, the top portion of the metal gate stack includes a metal fill layer disposed over a WFM layer, where sidewalls of the metal gate stack are continuous with sidewalls of the WFM layer, and the bottom portion of the metal gate stack includes the WFM layer filling space between the channel layer but is free of the metal fill layer. In some embodiments, the semiconductor structure includes two NS FETs disposed adjacent to each other, where the metal gate stacks configured to form the NS FETs differ in the composition of the WFM layer but share the same metal fill layer. Embodiments of the present disclosure provide methods of forming metal gate stacks in NS FETs with improved ability to tune $V_t$, lowered resistance of the metal fill layer, and greater design freedom in choosing gate contact locations for routing efficiency consideration.

In one aspect, the present embodiments provide a semiconductor structure that includes a substrate, a semiconductor fin protruding from the substrate, where the semiconductor fin includes semiconductor layers stacked in a vertical direction, a gate stack engaging with channel regions of the semiconductor fin, and S/D features disposed adjacent to the gate stack in S/D regions of the semiconductor fin. In the present embodiments, the gate stack includes a first portion disposed over the semiconductor layers and a second portion disposed between the semiconductor layers, where the first portion includes a WFM layer and a metal fill layer disposed over the WFM layer and the second portion includes the WFM layer but is free of the metal fill layer.

In another aspect, the present embodiments provide a semiconductor structure that includes a stack of semiconductor layers disposed over a substrate, a gate structure disposed over the stack of semiconductor layers, and S/D features disposed in the stack of semiconductor layers, such that the gate structure is interposed between the S/D features. In the present embodiments, the gate structure includes a first metal layer and a second metal layer disposed over a top surface of the first metal layer, where the first metal layer fills in space between the stack of semiconductor layers and the first metal layer includes at least one WFM layer and the second metal layer differs from the first metal layer in composition.

In yet another aspect, the present embodiments provide a method that includes forming a fin including a multi-layer stack (ML) of alternating first semiconductor layers and second semiconductor layers over a substrate, where the first semiconductor layers and the second semiconductor layers differ in composition, forming a dummy gate stack over a channel region of the fin, forming S/D features in the fin, such that the dummy gate stack is interposed between the S/D features, removing the dummy gate stack to form a first trench, removing the second semiconductor layers to form openings between the first semiconductor layers, and subsequently forming a metal gate stack. In the present embodiments, forming the metal gate stack includes forming a first metal layer over the substrate, thereby filling the first trench to form a top gate stack and filling the openings to form a bottom gate stack, removing a top portion of the top gate stack to form a second trench, and forming a second metal layer in the second trench, where the second metal layer differs from the first metal layer in composition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a protrusion extending from a substrate;
a plurality of semiconductor layers stacked in a vertical direction above the protrusion;
a gate stack engaging with channel regions of the semiconductor layers, wherein the gate stack includes a first portion disposed over a top semiconductor layer of the semiconductor layers and a second portion disposed below the top semiconductor layer of the semiconductor layers, wherein the first portion includes a work-function metal (WFM) layer over the semiconductor layers and a conductive layer disposed over the WFM layer, and wherein the second portion includes the WFM layer, wherein a sidewall of the WFM layer aligns with a sidewall of the conductive layer; and
source/drain (S/D) features disposed adjacent to the gate stack.

2. The semiconductor structure of claim 1, wherein the WFM layer includes TiN, TaN, TiAl, TiAlN, TaAl, TaAlN, TaAlC, TaCN, WNC, or combinations thereof, and the conductive layer includes W, Co, Ru, or combinations thereof.

3. The semiconductor structure of claim 1,
wherein the conductive layer has a first length spanning a length of the gate stack along a first direction, the WFM layer has a second length along the first direction,
wherein the first length is greater than the second length.

4. The semiconductor structure of claim 1, further comprising a gate contact feature electrically coupled to the gate stack, wherein the gate contact feature is vertically offset from the semiconductor layers.

5. The semiconductor structure of claim 4, wherein the gate contact feature directly lands on the conductive layer.

6. The semiconductor structure of claim 1, wherein the conductive layer has less resistance than the WFM layer.

7. The semiconductor structure of claim 1, wherein a first thickness of the conductive layer in the first portion is at least the same as a second thickness of the WFM layer in the first portion, the first thickness and the second thickness being measured along the vertical direction.

8. The semiconductor structure of claim 1, wherein the second portion is free of the conductive layer.

9. The semiconductor structure of claim 1, further comprising:
a shallow trench isolation (STI) structure adjacent the protrusion, wherein a top surface of the STI structure is lower than a top surface of the protrusion.

10. A semiconductor structure, comprising:
a stack of semiconductor layers disposed over a substrate;
a gate structure disposed over the stack of semiconductor layers,
wherein the gate structure includes a gate dielectric layer wrapping around each semiconductor layer in the stack and over a topmost semiconductor layer of the stack, a first conductive layer over the gate dielectric layer and filling in spaces among the semiconductor layers in the stack and having a portion above the topmost semiconductor layer of the stack, and a second conductive layer disposed on the first conductive layer, wherein the first conductive layer includes at least one work-function metal (WFM) layer, and the second conductive layer differs from the first conductive layer in composition, wherein a top surface of the gate dielectric layer is above a top surface of the first conductive layer; and
a gate contact structure landing on the second conductive layer.

11. The semiconductor structure of claim 10, wherein the stack of semiconductor layers is a first stack of semiconductor layers, the gate structure is a first gate structure, and the gate dielectric layer is a first gate dielectric layer, the semiconductor structure further comprising:
a second stack of semiconductor layers disposed over the substrate and adjacent to the first stack of semiconductor layers; and
a second gate structure disposed over the second stack of semiconductor layers,
wherein the second gate structure includes a second gate dielectric layer wrapping around each semiconductor layer in the second stack and over a topmost semiconductor layer of the second stack, a third conductive layer over the gate dielectric layer and filling in spaces among the semiconductor layers in the second stack, and the second conductive layer disposed over a top surface of the third conductive layer, wherein the third conductive layer includes at least one WFM layer, and the third conductive layer differs from the first conductive layer in composition.

12. The semiconductor structure of claim 11, further comprising:
n-type source/drain features adjacent to the semiconductor layers in the first stack; and
p-type source/drain features adjacent to the semiconductor layers in the second stack.

13. The semiconductor structure of claim 10, wherein the second conductive layer has a sidewall that directly contacts a sidewall of the gate dielectric layer.

14. The semiconductor structure of claim 10, wherein gate contact structure is vertically aligned with the stack of semiconductor layers.

15. The semiconductor structure of claim 10, wherein gate contact structure is vertically offset from the stack of semiconductor layers.

16. The semiconductor structure of claim 10, wherein the first conductive layer includes one or more WFM selected from TiN, TaN, TiAl, TiAlN, TaAl, TaAlN, TaAlC, TaCN, WNC, or combinations thereof, wherein the second conductive layer includes W, Co, Ru, or combinations thereof.

17. A semiconductor structure, comprising:
a substrate having a protrusion;
a plurality of semiconductor layers stacked in a vertical direction above the protrusion; and
a gate stack engaging with channel regions of the semiconductor layers, wherein the gate stack includes a top portion over a bottom portion, wherein the bottom portion includes a gate dielectric layer wrapping around each of the semiconductor layers and a work-function metal (WFM) layer wrapping around the gate dielectric layer, and the top portion includes a conductive layer landing on the WFM layer and interfacing sidewall portions of the gate dielectric layer,
wherein a topmost surface of the WFM layer and a topmost surface of the conductive layer are on different levels,
wherein a top surface of the gate dielectric layer is coplanar with the topmost surface of the conductive layer.

18. The semiconductor structure of claim 17, wherein the conductive layer has a first thickness, the WFM layer has a second thickness, and the second thickness is greater than the first thickness.

19. The semiconductor structure of claim 18, wherein the conductive layer has less resistance than the WFM layer.

20. The semiconductor structure of claim 17, further comprising:
gate isolation features extending along sidewalls of the gate stack, wherein each of the top and the bottom portions of the gate stack spans an entire width between the gate isolation features, wherein the gate stack has a top surface below top surfaces of the gate isolation features.

* * * * *